United States Patent [19]
Kanbara et al.

[11] Patent Number: 6,086,979
[45] Date of Patent: Jul. 11, 2000

[54] ELECTROMAGNETICALLY SHIELDING BONDING FILM, AND SHIELDING ASSEMBLY AND DISPLAY DEVICE USING SUCH FILM

[75] Inventors: Hisashige Kanbara; Hiroyuki Hagiwara, both of Oyama; Minoru Tosaka, Shimodate, all of Japan

[73] Assignee: Hitachi Chemical Company, Ltd., Tokyo, Japan

[21] Appl. No.: 08/976,641

[22] Filed: Nov. 24, 1997

[30] Foreign Application Priority Data

Nov. 11, 1997 [JP] Japan ................................. 9-308458
Nov. 11, 1997 [JP] Japan ................................. 9-308459
Nov. 11, 1997 [JP] Japan ................................. 9-308460

[51] Int. Cl.$^7$ ............................................ B32B 3/00
[52] U.S. Cl. ..................... 428/209; 428/458; 428/349; 428/344; 422/186.02; 174/35 R
[58] Field of Search .................... 428/328, 344, 428/209, 349, 458; 174/35 R; 422/186.02

[56] References Cited

U.S. PATENT DOCUMENTS

| | | | |
|---|---|---|---|
| 3,612,743 | 10/1971 | Angele et al. | 174/35 |
| 4,008,383 | 2/1977 | Tanaka et al. | 219/10.55 D |
| 4,514,585 | 4/1985 | Paynton | 174/35 GC |
| 4,542,076 | 9/1985 | Bednarz et al. | 428/624 |
| 4,658,958 | 4/1987 | McNulty et al. | 206/328 |
| 4,932,755 | 6/1990 | Holdridge et al. | 174/35 MS |
| 4,939,027 | 7/1990 | Daimon et al. | 428/284 |
| 4,973,511 | 11/1990 | Farmer et al. | 428/216 |
| 5,017,419 | 5/1991 | Smith | 428/209 |
| 5,122,619 | 6/1992 | Dlubak | 174/35 R |
| 5,178,955 | 1/1993 | Aharoni et al. | 428/421 |
| 5,314,732 | 5/1994 | Wiste | 428/35.3 |
| 5,373,102 | 12/1994 | Ehrlich et al. | 174/35 R |
| 5,573,857 | 11/1996 | Auger | 428/480 |
| 5,804,102 | 9/1998 | Oi et al. | 252/587 |
| 5,855,988 | 1/1999 | Matsuo | 428/195 |

FOREIGN PATENT DOCUMENTS

| | | |
|---|---|---|
| 62-57297 | 3/1987 | Japan . |
| 1-170098 | 7/1989 | Japan . |
| 1-278800 | 11/1989 | Japan . |
| 2-52499 | 2/1990 | Japan . |
| 3-35284 | 2/1991 | Japan . |
| 5-269912 | 10/1993 | Japan . |
| 5-283889 | 10/1993 | Japan . |
| 5-323101 | 12/1993 | Japan . |
| 5-327274 | 12/1993 | Japan . |

*Primary Examiner*—Deborah Jones
*Assistant Examiner*—Cathy F. Lam
*Attorney, Agent, or Firm*—Dickstein Shapiro Morin & Oshinsky, LLP

[57] ABSTRACT

An electromagnetic sheilding bonding film has a substantially transparent base film and an electroconductive metallic material layer geometrically patterned on the base film to have an aperture ratio of 50% or more. A bonding agent layer is placed at least over a part of the plastic base film not covered by the electroconductive metallic material layer and has a predetermined selectively given fluidity.

19 Claims, 2 Drawing Sheets

ELECTROMAGNETICALLY SHIELDING BONDING FILM, AND SHIELDING ASSEMBLY AND DISPLAY DEVICE USING SUCH FILM

TECHNICAL FIELD

The present invention relates to bonding film which is capable of shielding electromagnetic radiation from the front surface of such display devices as CRT, PDP (plasma display), LCD, and EL, and blocking infrared radiation. The present invention also relates to a display device and an electromagnetic shielding assembly using such film.

BACKGROUND OF THE INVENTION

Recently, with the increase in the use of various electric and electronic appliances, problems of electromagnetic noises or interferences (EMI) have been on the increase.

Such noises may be generally classified into conduction noises and emission or radiation noises. The use of noise filters is a typical measure against conduction noises. As for radiation noises, it is necessary to electromagnetically insulate a prescribed space. To this end, the appliance may be enclosed in a metallic or otherwise electroconductive casing, a metallic plate may be placed between the two circuit boards, or metallic foil may be wrapped around the cable. These measures may provide an adequate electromagnetic shield for the circuit or the power source block, but are unsuitable for shielding electromagnetic radiation which may be produced from the front surface of a display device such as a CRT or a PDP because such measures require art opaque material layer to be placed in front of the display device.

Methods for providing both an electromagnetic shielding effect and a transparency have been previously proposed (see Japanese patent laid open publications Nos. 1-278800 and 5-323101) which are based on forming electroconductive thin film over the surface of a transparent base member by vapor depositing metal or metal oxide.

There have also been proposed EMI shielding materials having highly electroconductive fibers embedded in a transparent base material layer (see Japanese patent laid open publications Nos. 5-327274 and 5-269912), EMI shielding materials having electroconductive resin material containing metallic powder or the like directly deposited or printed on a transparent base board (see Japanese patent laid open publications Nos. 62-57297 and 2-52499), and an electromagnetic shielding material having a transparent resin layer formed over a transparent base board such as a polycarbonate board having the thickness of approximately 2 mm, and a copper layer of a mesh pattern formed over the resin layer by electroless plating (see Japanese patent laid open publication No. 5-283889).

According to the methods of forming a thin electroconductive layer by vapor depositing metal or metal oxide onto a transparent base board which were proposed in Japanese patent laid open publications Nos. 1-278800 and 5-323101 and purported to achieve both an EMI shielding capability and a transparency, if the thickness of the electroconductive layer is reduced to a sufficient level (a few hundred Å to 2,000Å), the surface resistance of the electroconductive layer becomes so large that the shielding effect for the frequency range of 30 MHz to 1 GHz will be less than 20 dB which is significantly lower than the required level of 30 dB or more.

As for the EMI shielding material consisting of a transparent base member having electroconductive fibers embedded therein such as those proposed in Japanese patent laid open publications Nos. 5-327274 and 5-269912, a sufficiently high electromagnetic shielding effect of 40 to 50 dB can be achieved for the frequency range of 30 MHz to 1 GHz but the fiber diameter which is required for regularly arranging the electroconductive fibers so as to achieve such a shielding effect becomes as large as 35 µm, and the fibers are so visible (which is referred to as "visibility" hereinafter) that the shielding material is quite unfit for application to display devices. In the ease of the EMI shielding material made by directly printing electroconductive ink containing metallic powder or the like on a transparent base board as proposed in Japanese patent laid open publications Nos. 62-57297 and 2-52499, similarly, the line width is no less than 100 µm due to the limitation of printing precision so that the visibility makes the material unsuitable. As for the shielding material formed by forming a transparent resin layer over a transparent base board made of a polycarbonate plate or the like having a thickness in the order of 2 mm, and forming a copper mesh pattern thereon by electroless plating as proposed in Japanese patent laid open publication No. 5-283889, the surface of the transparent base board is required to be roughened or made coarse so as to achieve a sufficient adhesive power for the electroless plating. This roughening process requires the use of toxic oxidants such as chromic acid and permanganate add, and can produce a desired ret only when the base board is made of ABS resin. According to this method, even when an EMI shielding effect and a transparency are both achieved, the thickness of the transparent base board cannot be reduced to a sufficient level so that the material is not suited to be formed into a sufficiently thin film or web. If the transparent base board has a significant thickness, as it cannot be closely attached to the surface of the display device, there will be a leakage of electromagnetic radiation. Also, in regard to the manufacturing process, because the shielding material cannot be put into the form of rolls, the material tends to be undesirably bulky and the unsuitability of the material to automation causes an increase in the production cost. In addition to the EMI shielding performance of 30 dB or more in the frequency range of 30 MHz to 1 GHz, such shielding material is required to have be capable of blocking infrared radiation in the wavelength range of 900 to 1,000 nm emitted from the front surface of the display device as it may interfere with VTR and other equipment using a remote control. Additionally is required a favorable transparency for visible light. In addition to the transparency, the material is required to have a favorable bonding property which allows it to be closely attached to the display surface so as to effectively shut off electromagnetic radiation, and to achieve a invisibility which makes the presence of the shielding material unnoticeable to the viewer.

The bonding property includes the capability of the material to be attached to the surface of any one of a number of widely used polymer plate materials as well as to the surface of glass at a relatively low temperature, and to continue to maintain the close contact with the material over extended periods of time. However, such desirable material has not been hitherto available.

BRIEF SUMMARY OF THE INVENTION

In view of such problems of the prior art, a primary object of the present invention is to provide electromagnetic shielding bonding film which has a favorable EMI shielding performance, transparency, invisibility, and favorable bonding property.

A second object of the present invention is to provide electromagnetic shielding bonding film which is economical to manufacture and simple in structure.

A third object of the present invention is to provide a display device and an electromagnetic shielding assembly using such film.

These and other objects may be accomplished by providing Electromagnetic shielding bonding film, comprising; substantially transparent plastic base film; an electroconductive metallic material layer which is geometrically patterned on the plastic base film so as to have an aperture ratio of 50% or more; and a bonding agent layer placed at least over a part of the plastic base film not covered by the electroconductive metallic material layer, the bonding agent layer being adapted to be selectively given with fluidity.

To the end of providing electromagnetic shielding bonding film which is economical and suited for mass production, and has a favorable electromagnetic shielding and optically transparent property, and a convenient bonding property, the invention provides an electromagnetic shielding bonding film, characterized by plastic film carrying a bonding agent layer, and an electroconductive metallic material layer which is geometrically patterned by micro-lithography so as to have all aperture ratio of 50% or more.

The bonding agent layer may flow under heat and/ore pressure. In such a case, to the end of providing electromagnetic shielding bonding film which has a favorable electromagnetic shielding and optically transparent property, and a convenient bonding property, the softening temperature of the bonding agent layer which flows under heat or pressure ay be 200° C. or lower.

The bonding agent layer may be adapted to cure when active radiation energy is radiated upon it. In this case, to the end of providing electromagnetic shielding bonding film which has a favorable electromagnetic shielding and optically transparent property, and a convenient bonding property, the active radiation energy may consist of ultraviolet or electron beam radiation.

Alternatively, the bonding agent layer may consist of thermosetting resin. In this case, to the end of providing electromagnetic shielding bonding film which has a favorable electromagnetic shielding and optically transparent property, and a convenient bonding property which is reliable over an extended period of time, the care index of the bonding agent layer consisting of thermosetting resin may be less than 60%.

To the end of providing electromagnetic shielding bonding film which has a favorable electromagnetic shielding and optically transparent property, and a convenient bonding property, the electroconductive metallic layer may be geometrically patterned by a micro-lithography which for instance may consist of photo-lithography.

To the end of providing electromagnetic shielding bonding film which has a favorable electromagnetic shielding and optically transparent property, and a convenient bonding property, the bonding agent layer may have a refraction index of 1.45 to 1.70.

To the end of providing electromagnetic shielding bonding film which has a favorable electromagnetic shielding and optically transparent property, and a convenient bonding property, the bonding agent layer may have a larger thickness than the electroconductive metallic material layer.

To the end of providing electromagnetic shielding bonding film which has a favorable electromagnetic shielding and optically transparent property, and a convenient bonding property, the bonding agent layer may contain an infrared absorbing agent.

To the end of providing electromagnetic shielding bonding film which has a favorable electromagnetic shielding and optically transparent property, and a convenient bonding property, the geometrically patterned electroconductive metallic material layer may have a line width of 40 $\mu$m or less, a line spacing of 100 $\mu$m or more and a line thickness 40 $\mu$m or less.

To the end of providing electromagnetic shielding bonding film which has a favorable electromagnetic shielding and optically transparent property, and a convenient bonding property, the geometrically patterned electroconductive metallic material layer may consist of a copper, aluminum or nickel layer having a thickness of 0.5 to 40 $\mu$m To the end of providing electromagnetic shielding bonding film which has a favorable electromagnetic shielding and optically transparent property, and a convenient bonding property, the photo-lithography may consist of a chemical etching process.

To the end of providing electromagnetic shielding bonding which has a favorable electromagnetic shielding and optically transparent property, and a convenient bonding property, t the plastic film carrying the electroconductive metallic material layer may consist of polyethyleneterephthalate film or polycarbonate film.

To the end of providing electromagnetic shielding bonding film which is resistant to fading, and capable of providing high contrast images, the electroconductive metallic material may consist of copper which at least has a darkened surface.

To the end of providing electromagnetic shielding bonding film which is effective in shielding a magnetic field, the electroconductive metallic material may consist of paramagnetic metallic material

BRIEF DESCRIPTION OF THE DRAWINGS

Now the present invention is described in the following with reference to the appended drawings, in which.

DETAILED DESCRIPTION OF THE PREFERRED EMBODIMENTS

Figure 1A:
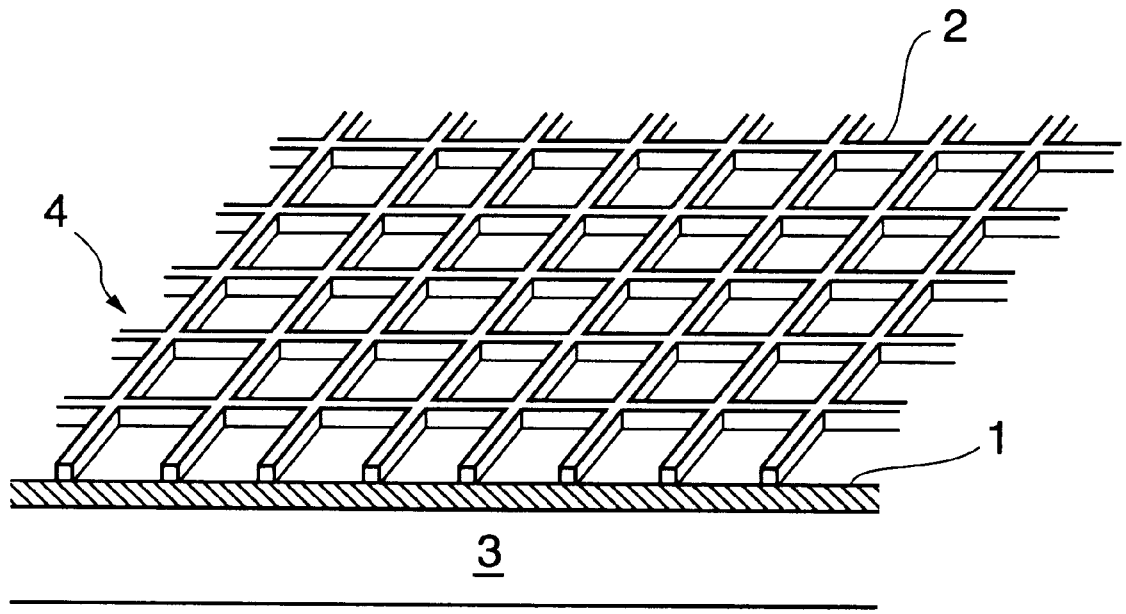
FIG. 1 is a perspective view (a) and a sectional view (b) of the electromagnetic shielding bonding film according to the present invention.

Now the present invention is described in the following in more detail.

The bonding agent layer which flows under heat or pressure preferably consists of a bonding agent composition which demonstrates a fluidity under a temperature of 200° C. or lower, or a pressure of 1 kgf/cm2 or higher, and should be able to readily attach electromagnetic shielding bonding film carrying geometrically patterned electroconductive material so as to define an aperture ratio of 50% or higher to a bonding object such as a display or a plastic plate by letting the bonding agent layer flow. The bonding agent layer flows out of the apertures of the geometrically patterned electroconductive material, and flows onto the surface of the geometrically patterned electroconductive material defining an aperture ratio of 50% or higher, and the surface of the bonding object so that the electromagnetically shielding bonding film and the bonding object may be readily attached to each other. Because of this fluidity, the electromagnetically shielding bonding film may be readily attached to the bonding object, even when the bonding surface is curved or consists of an otherwise complex shape by lamination or press molding. To this end the softening temperature of the bonding agent layer is preferred to be 200° C. or lower. The softening temperature is defined as a temperature at which the viscosity of the material falls below $10^{12}$poise, and a fluidity can be observed in one to ten seconds when that temperature is reached.

The bonding agent compositions which can be used for such a bonding agent layer which flows under heat or pressure include such thermoplastic resin materials as dienes such as natural rubber (refraction index: n=1.52), polyisoprene (n=1.521), poly-1,2-butadiene (n=150), polyisobutane (n=1.505 to 1.51), polybutane (n=1.513), poly-2-heptyl-1,3-butadiene (n=1.50), poly-2-t-butyl-1,3-butadiene (n=1.506) and poly-1,3-butadiene (n=1.515), polyethers such as polyoxy-ethylene (n=1.456), polyoxy-propylene (n=1.450), polyvinyl-ethylether (n=1.454), polyvinyl-hexylether (n=1.459) and polyvinyl-butylether (n=1.456), polyesters such as polyvinyl-acetate (n=1.467), and polyvinyl-propionete (n=1.467), polyurethane (n=1.5 to 1.6), ethylcellulose (n=1.479), polyvinyl-chloride (n=1.54 to 1.55), polyacrylonitrile (n=1.52), polymethacrylonitrile (n=1.52), polysulfone (n=1.633), polysulfide (n=1.6) phenoxy resin (n=1.5 to 1.6), and poly (metha) acrylic acid esters such as polyethyl-acrylate (n=1.4685), polybutyl-acrylate (n=1.466), poly-2-ethylhexyl-acrylate (n=1.463), poly-t-butyl-acrylate (n=1.4638), poly-3-ethoxypropyl-acrylate (n=1.465), polyoxycarbonyl-tetramethacrylate (n=1.465), polymethyl-acrylate (n=1.472 to 1.480), polyisopropyl-methacrylate (n=1.473), polydodecil-methacrylate (n=1.474), polytetradecil-methacrylate (n=1.475), poly-n-propyl-methacrylate (n=1.484), poly-3,3,5-trimethyl-cyclohexyl-methacrylate (n=1.484), polyethyl-methacrylate (n=1.485), poly-2-nitro-2-methylpropyl-methacrylate (n=1.487), poly-1,1-diethylpropyl-methacrylate (n=1.489), and polymethyl-methacrylate (n=1.489). Two or more these acrylic polymers may be copolymerized, or may be mixed together as required.

Copolymers of acrylic resin and other resin materials may also be used, and they inlcude epoxyacrylates (n=1.48 to 1.60), urethaneacrylates (n=1.5 to 1.6), polyetheracrylates (n=1.48 to 1.49), and polyesteracrylates (n=1.48 to 1.54). In terms of bonding property, urethaneacrylates, epoxyacrylates and polyetheracrylates are particularly desirable. Such epoxyacrylates include (metha)acrylic acid derivatives such as 1,6-hexandiol-diglycidylether, neopenthylglycol-diglycidylether, arylalcohol-diglycidylether, resorcinol-diglycidylether, diglycidylester adipate, diglycidylester phthalate, polyethyleneglycol-diglycidylesther, trimethylolpropane-triglycidylether, glycerin-triglycidylether, pentaerythritol-tetraglycidylether, and sorbitol-tetraglycidylether. Epoxyacrylates are effective in improving bonding property as they contain hydroxyl groups in their molecules, and these copolymers can be used either individually or in combination. The softening temperature of the polymer that can be used for the bonding agent of the present invention is preferably 200° C. or lower for the convenience of handling, and is even more preferable if it 150° C. or lower. Because such electromagnetic shielding bonding film is normally used in the environments of 80° C. or lower, in view of the workability, the most preferred range of the softening temperature is 80to 120° C. The weight-average molecular weight of the main polymer in the bonding agent should be son or greater. If the molecular weight is less than 500, the cohesive force of the composition is so small that a satisfactory attachment to the object may not be achieved.

A diluting agent, plasticizer, anti-oxidixation agent, filler, coloring agent, UV absorbing agent, and viscosity increasing agent may be added to the bonding agent composition as required.

The refractive index of the bonding agent layer which flows under heat or pressure is preferably in the range of 1.45 to 1.70. This is because if there is any significant difference in refraction index between the plastic film and the bonding agent which are used in the invention, and the bonding agent of the present invention and the bonding agent which is used for attaching electroconductive metallic material to the plastic film, the visible light transmission factor drops. However, if the refractive index is in the range of 1.45 to 1.70 such a drop in the visible light transmission facto can be avoided, and the polymers mentioned above all fall within this range.

The electroconductive metallic material as used in this application includes a metal or an alloy of two or more selected from a group consisting of copper, aluminum, nickel, iron, gold, silver, stainless steel, tungsten, chromium and titanium. In view of electroconductivity, suitability for circuit fabrication and cost, copper, aluminum and nickel are particularly suitable. The material preferably should be in the form of metallic foil, plating, vapor deposition or other film formed in vacuum having a thickness of 0.5 to 40 μm. If the thickness exceeds 40 μm, forming the fine lines becomes difficult, and the visible angle is reduced If the thickness falls below 0.5 μm, the surface resistance increases to such an extent that the electromagnetic shielding effect may become inadequate.

It is preferable if the electroconductive metallic material consists of copper having at least its surface darkened because a high contrast can be achieved. Also, the oxidization and fading of the electroconductive material over time can be avoided. The darkening process can be carried outer either before or after the process of forming the geometric pattern, but is normally carried out after forming the geometric pattern in the manner well known in the art of printed circuit boards. For instance, the darkening process may consist of processing the metallic material in a water solution of sodium chlorite (31 g/liter), sodium hydroxide (15 g/liter), and trisodium phosphate (12 g/liter) for 2 minute at 95° C. It is desirable if the electroconductive material consists of paramagnetic metal as it improves the magnetic shielding effect in addition to the shielding effect against an electric field. Such electroconductive material can be most easily brought into close contact with plastic film of the above described type by bonding these two material layers together via a bonding agent layer which may essentially consist of acrylic or epoxy resin. When the thickness of the layer of the electroconductive material is desired to be reduced, it can be achieved by one or a combination of two or more of the thin film forming methods selected from a group consisting of vacuum deposition, sputterng, ion plating, chemical vapor deposition, and electroless and electric plating. The thickness of the electroconductive material is preferably 40 μm or less. The smaller the thickness of the electroconductive material, the greater the view angle becomes, and it makes the material particularly suitable for electromagnetic shielding material. It is particularly preferable if the thickness is 18 μm or less.

The plastic film as used in this application includes those made of polyesters such as polyethylene terephthalate (PET) and polyethylene naphthalate, polyolefins such as polyethylene, polypropylene, polystyrene and EVA, vinyl resins such as polyvinyl chloride and polyvinylidene chloride, polysulfone, polyethersulfone, polycarbonate, polyamide, polyimide, and acrylic resins which have a transmission factor of 70% or more for visible light, and a thickness of 1 mm or less. These materials may be used as a single layer or multi layer film combining two or more layers. In view of transparency, heat-resistance, handling and cost, polyethylene terephthalate and polycarbonate are particularly suitable. If the thickness is less than 5 μm, it becomes difficult to handle. If the thickness exceeds 500 μm, the visible light transmission factor in impaired. The thickness of the plastic film is preferably in the range of 5 to 200 μm. The thickness range of 10 to 200 μm is particularly preferable.

The geometric pattern as used in this application may consist of a triangle such as right triangle, equilateral triangle and right-angled triangle, a rectangle such as square, oblong, parallelepiped and trapezoid, a polygon such as hexagon, octagon, dodecagon and icosahedron, a circle, an ellipsoid or a star shape, or a combination of these, and these individual patterns may repeat by themselves or two or more of these patterns may be combined. Triangles are most effective in terms of the EMI shielding effect, but polygons having as many a side as possible are desirable in view of the transmission factor of visible light because of an increased aperture ratio. The aperture ratio is required to be 50% or more in view of the visible light transmission factor, and is more preferably 60% or more. The aperture ratio is defined as a percentile ratio of the area of the part of the effective surface area of the electromagnetic shielding bonding film which is not covered by the geometrically patterned electroconductive material to the entire effective area of the electromagnetic shielding bonding film. When the effective area or the electromagnetic bonding film is assumed as the area of the screen of a display device, the aperture ratio corresponds to the ratio of the visible area of the screen.

The geometric pattern preferably may be preferably carried out by forming the plastic film carrying the electroconductive metallic material by micro-lithography which includes photo-lithography, X-ray lithography, and ion beam lithography as well as screen printing. Of these methods, photo-lithography is particularly preferable in view of convenience and suitable for mass production. In particular, photo-lithography based on chemical etching is most preferable because its convenience, economy, and circuit fabrication precision. However, other forms of photo-lithography such as those based on electroless or electric plating or a combination of chemical etching with electroless or electric plating may also be used for geometrically patterning the electroconductive metallic material.

The line width of the geometric pattern should be 40 μm or less, the line spacing should be 100 μm or more, and the line thickness should be 40 μm or less. In view of transmission factor for visible light, it is even more preferable if the line width is 25 μm or less, the line spacing is 120 μm or more, and the line thickness is 18 μm or less. The line width is preferably 40 μm or less, or more preferably 25 μm or less, and because the surface resistance increases and the electromagnetic shielding effect is impaired if the line width is too small, is desired to be 0.5 μm or more, or more preferably 1 μm or more. The larger the line spacing is, the greater the aperture ratio becomes, and the visible light transmission factor improves. When the material is used on the front surface of a display device, the aperture ratio is required to be 50% or more, or more preferably 60% or more. If the line spacing is excessively, the electromagnetic shielding effect is impaired. Therefore, the line spacing is preferred to be 1,000 μm (1 mm) or less. When the geometric pattern is relatively complex, the line spacing may be defined by converting the open area of each repeating pattern unit into a square, and measuring the side of such a square.

The infrared absorbing agents that can be used in the present invention may include metal oxides such as iron oxide, cerium oxide, tin oxide and antimony oxide, indium-tin oxide (which is referred to as ITO hereinafter), tungsten hexachloride, tin chloride, copper (II) sulfide, chromium-cobalt complex salt, thiol-nickel complex compound, aminium compounds, diimonium compounds (marketed by Nihon Kayaku KK), antraquinone compounds (SIR-114), metallic complex compounds (SIR-128, SIR-130, SIR-132, SIR-159, SIR-152, and SIR-162), phthalocyanine (SIR-103) (these are marketed by Mitsui Toatsu Kagaku KK). Alternatively, these compounds may be dispersed in the bonding agent. It is also possible to disperse these compounds in binder resin which is then applied over the surface of the bonding agent which flows under heat or pressure. The binder resin having these compounds dispersed therein may be directly applied over the surface of plastic film so that the bonding agent layer which flows under heat or pressure may be applied thereon, or may be applied over the reverse surface of the assembly so as to define an infrared absorbing layer It is also possible to use plastic film which contains an infrared absorbing agent. The compounds which are particularly effective in absorbing infrared radiation include such infrared absorbing agents as copper (II) sulfide, ITO, aminium compounds, diimonium compounds, and metallic complex compounds. In case of infrared absorbing agents other than organic infrared absorbing agents, it is important to properly select the diameter of the primary particles. If the particle diameter is substantially larger than the wavelength of the infrared radiation, the blocking efficiency may be high, but the transparency drops because the irregular reflection by the surfaces of the particles cause a hazy appearance. If the particle diameter is excessively small, the shielding efficiency drops. The preferable range of the particle diameter is 0.01 to 5 μm, and an even more preferable range is 0.1 to 3 μm.

The infrared absorbing agent is evenly dispersed in binder resins which may comprise epoxy resins such as bisphenol type A epoxy resin, bisphenol type F epoxy resin, and novolac type epoxy resin, diene resins such as polyisoprene, poly-1,2-butadiene, polyisobutane, and polybutane, polyacrylic acid ester copolymers such as ethylacrylate, butylacrylate, 2-ethylhexylacrylate, and t-butylacrylate, polyester resins such as polyvinylacetate, polyvinylpropionate, and polyolefin resins such as polyethylene, polypropylene, polystyrene, and EVA. The mixture ratio of the infrared absorbing agent should be preferably 0.01 to 10 weight parts, and more preferably 0.1 to 5 weight parts for 100 weight parts of the binder. If the mixture ratio is less than 0.01 weight parts, a required infrared absorbing ratio cannot be achieved. If the mixture ratio is greater than 10 weight parts, a required transparency cannot be achieved.

Preferably, the bonding agent layer containing such an infrared absorbing agent is formed on one side of the plastic film, and the electroconductive metallic material is applied over the surface of the bonding agent layer. It is also possible, as mentioned earlier, to form a layer of composition containing the infrared absorbing agent and to apply a bonding agent layer (which may or may not contain the infrared absorbing agent) which flows under heat or pressure over the surface of the composition layer. Alternatively, the layer of composition containing the infrared absorbing agent may be applied to the surface of the electromagnetic shielding bonding film opposite to that carrying the electroconductive metallic material. It may also be formed in any one of the layers of the electromagnetic shielding assembly which comprises a layer of electromagnetic shielding bonding film and a plastic plate. It he electromagnetic shielding assembly consists of a layer of electromagnetic shielding bonding film and a plastic plate, the infrared absorbing agent may be applied to the surface A of the electromagnetic shielding bonding film, the interface B between the electromagnetic shielding bonding film and the plastic plate, or the surface C of the plastic plate. In this case, the composition containing an infrared absorbing agent may be formed at least on one of the surfaces A, B or C. At least one layer containing an infrared absorbing agent is necessary, and the remaining layers may not contain any infrared absorbing agent. The layer containing the infrared absorbing agent is preferably provided with a bonding property to improve the work efficiency and the workability.

More specifically, the infrared absorbing composition is applied over the surface of the bonding layer of the electromagnetic shielding bonding film or the reverse surface of the film to the thickness of 0.1 to 10 µm. The infrared absorbing composition maybe cured by using heat or ultraviolet radiation. The infrared absorbing composition may also be directly mixed with the bonding agent composition of the bonding agent layer which flows under heat or pressure. The amount of the infrared absorbing composition that would be added in this case is preferably in the range of 0.01 to 5 weight parts for 100 weight parts of the polymer which essentially forms the bonding agent in view of the efficacy and the transparency.

The plastic plate used in the present invention consists of a plate made of such materials as thermoplastic polyester resins such as polystyrene resin (n=1.59), acrylic resin (n=1.49), polymethylmethacrylate resin (n=1.49), polycarbonate resin (n=1.58), polyvinylchloride resin (n=1.54), polyvinylidene-chloride resin (n=1.6 to 1.63), polyethylene resin (n=1.51), polypropylene resin (n=1.50), polyamid resin (n=1.52), polyamide-imide resin (n=1.5), polyetherimide resin (n=1.5), polyetherketone resin (n=1.45), polyarylate resin (n=1.5 to 1.6), polyacetal resin (n=1.5 to 1.6), polybutylene-terephthalate resin (n=1.57), polyethylene-terephthalate resin (n=1.58), and other thermoplastic or thermosetting resins as cellulose acetate resin (n=1.49), fluoride resins (n=1.4 to 1.5), polysulfone resin (n=1.63), polyethersulfone resin (n=1.45 to 1.6), polymethylpentene resin (n=1.45 to 1.6), polyurethane resin (n=1.45 to 1.6), and diarylphthalate resin (n=1.45 to 1.6). In particular, polystyrene resin, acrylic resin, polymethylmethacrylate resin, polycarbonate resin, polyvinylchloride resin, polyethylene-terephthalate resin, and polymethylpentene resin are preferred because of their favorable transparency. The plastic plate according to the present invention preferably has a thickness in the range of 0.5 mm to 5 mm in view of protection for the display device as well as the mechanical strength and the ease of handling.

Figure 1B:
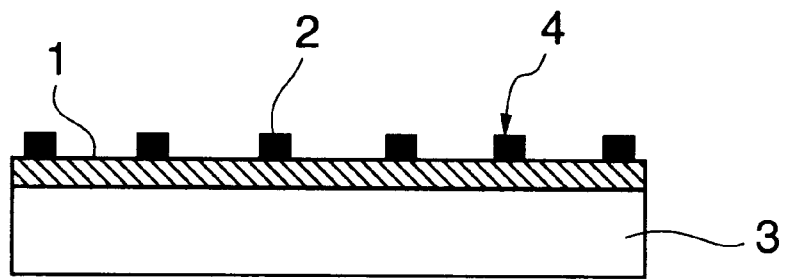
Figure 2A:
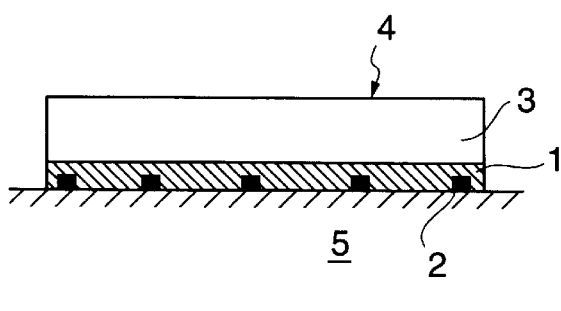
FIG. 2 show an example of application of the electromagnetic shielding bonding film of the present invention to a display device (a) and different examples (b) to (f) of the electromagnetic shielding assemblies of the present invention, all by sectional views.
Figure 2B:
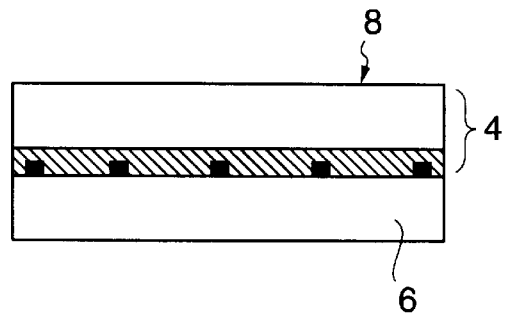
Figure 2C:
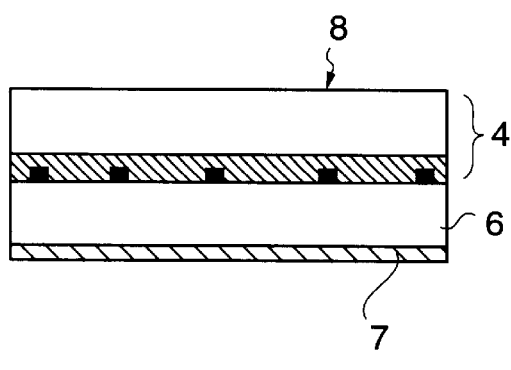
Figure 2D:
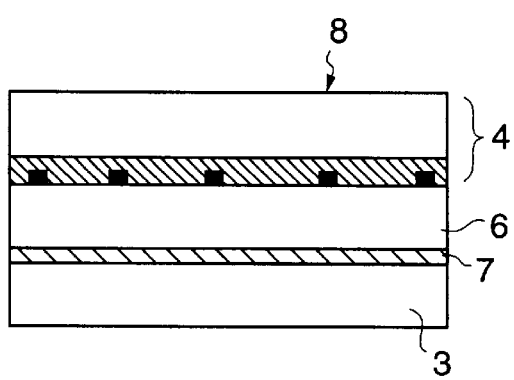
Figure 2E:
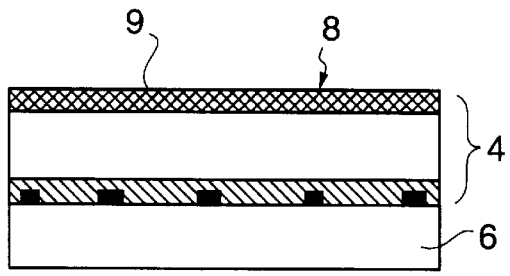
Figure 2F:
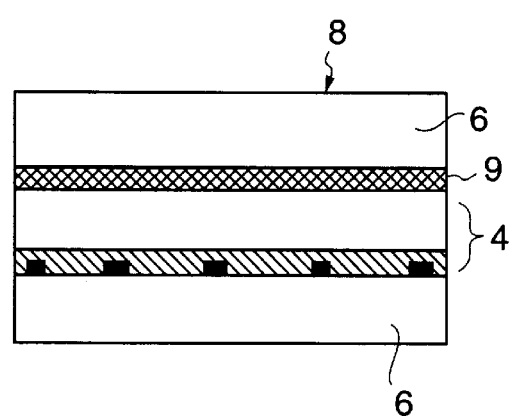

The electromagnetic shielding assembly of the present invention comprises electromagnetic shielding bonding film and a plastic plate, and these components may be combined in any one of a number of ways. FIG. 1 shows a perspective view (a) and a sectional view (b) of the electromagnetic shielding bonding film 4 which consists of a bonding agent layer 1 which flows under heat or pressure, a geometrically patterned electroconductive metallic material layer 2, and plastic film 3. The electromagnetic shielding bonding film 4 may be directly formed on the surface of the screen 5 of a display device as illustrated in FIG. 2(a) or may be formed on one side of a plastic plate 6 which is attached to the screen 5 of a display device via a bonding agent applied to either side of the assembly or via a mounting bracket as illustrated in FIG. 2(b). FIG. 2(c) shows an example of the electromagnetic shielding assembly 8 which is formed by applying a bonding agent composition 7 containing an infrared absorbing agent which is described hereinafter on one side of a plastic plate 6 and electromagnetic shielding bonding film 4 on the other side of the plastic plate 6. FIG. 2(d) shows an example of the electromagnetic shielding assembly 8 which is formed by applying a bonding agent composition 7 containing an infrared absorbing agent which is descibed hereinafter on one side of plastic film 3 which is attached to a plastic plate 6 via this bonding agent layer, and applying electromagnetic shielding bonding film 4 on the other side of the plastic plate 6. FIG. 2(e) shows an example of the electromagnetic shielding assembly 8 which comprises electromagnetic shielding bonding film 4 and a plastic plate 6, and is attached to the screen 5 of a display device via a bonding agent layer 9 which is formed on the surface of the electromagnetic shielding bonding film 4. FIG. 2(f) shows an example of the electromagnetic shielding assembly 8 which is formed by applying a bonding agent layer 9 on the surface of the plastic film of the electromagnetic shielding bonding film 4, and attaching another plastic plate 6 to the side of the electromagnetic shielding bonding film 4 carrying the geometrically patterned electroconductive metallic material. An infrared blocking layer, anti-reflection layer, anti-glare layer and anti-scratch hard layer may be formed on any surface of the electromagnetic shielding bonding film or the electromagnetic shielding assembly. These are intended merely as exemplary, and other different embodiments are possible. It is also possible to attach the electromagnetic shielding bonding film on one side of a sheet of glass, and mount the glass sheet in front of a display screen with the glass surface facing outward.

The electromagnetic shielding bonding film of the present invention essentially consists of a bonding agent layer which flows under heat or pressure, geometrically patterned electroconductive metallic material, and plastic film. The electroconductive metallic material preferably consists of metal foil, and in such a case, the bonding surface of the metallic foil is typically made into a coarse surface so as to achieve a desired bonding strength. When the electroconductive metallic material is geometrically patterned, the part of the surface of the bonding layer from which the electroconductive metallic material has been removed presents an irregular surface because the marks of the reverse surface of the electroconductive metallic material were imprinted on the surface of the bonding layer, and the resulting irregular reflection of visible light on the surface may damage the transparency of the plastic film. It may also the case that the surface of the plastic film may be intentionally given with an irregular texture by adding a small amount of filler with the aim of improving the molding result, and reducing the friction of the film to facilitate the winding of the plastic film into a roll, and by applying a matte process to increase the bonding force of the bonding agent The transparency of the plastic film may be thus damaged by the irregular surface texture in the part of the surface of the plastic film from which the electroconductive material has been removed or the plastic film itself due to the intentional surface roughening process to improve the bonding property and due to the imprinting of the surface texture of the reverse surface of the electroconductive metallic material. However, the bonding layer of the present invention fills such irregular surface textures, and in particular, when resin material having a refraction index close to that of the plastic film is smoothly coated over the surface, irregular surface reflection can be minimized. The imprinting of the marks on the reverse surface of the electroconductive metallic material on the film surface can be resolved by the flow of the bonding agent layer along the surface of the plastic film so that a transparency is regained. The geometrically patterned electroconductive metallic material on the film surface has such a small line width that it is virtually invisible to naked eyes. Also, because of the sufficient large spacing, an apparent transparency can be attained. However, the line spacing of the geometric pattern is sufficiently small than the wavelength of the electromagnetic radiation which is to be shielded so that a favorable shielding property can be achieved.

<Example #A1>

<Electromagnetic Shielding Bonding Film #A1 and Electromagnetic Shielding Assembly #A1>

The plastic film consisted of transparent polyethyleneterephthalate (PET film having the thickness of 50 μm (marketed by Toyo Boseki KK under the tradename of A-4100, refraction index n=1,575). Bonding Agent Layer #A1 containing an infrared absorbing agent which is described hereinafter was applied on one side of this plastic film to a prescribed dry thickness at room temperature by using an applicator, and was heated and dried at 90° C. for 20 minutes. An electrolytic copper foil having the thickness of 12 μm serving as the electroconductive metallic material was laminated over the surface of Bonding Agent Layer #A1 with its coarse surface facing the bonding layer, and was laminated by heating, under the condition of 180° C. and 30 kgf/cm² to obtain PET film carrying copper foil as plastic film carrying electroconductive material.

The obtained PET film laminated with copper foil is subjected to a photo-lithographic process (including the steps of resist film coating, photographic exposure, photographic development, chemical etching, and resist film removal), and a copper grid pattern having the line width of 25 μm and the line spacing of 250 μm was formed on the surface of the PET film to obtain Electromagnetic Shielding Bonding Film #A1. The visible light transmission factor of Electromagnetic Shielding Bonding Film #A1 was 20% or less. Thereafter, Electromagnetic Shielding Bonding Film #A1 was applied over the surface of commercially available acrylic plate (marketed by KK Kurare under the tradename of Komoglass, thickness 3 mm, n=1.49) by using a thermal press, with the bonding layer facing the acrylic plate, under the temperature and pressure condition of 110l20 C., 20 kgf/cm² and 15 minutes to obtain Electromagnetic Shielding Assembly #A1.

Example #A1 consisted of Electromagnetic Shielding Assembly #A1 which was formed by combining Electromagnetic Shielding Bonding Film #A1 carrying Bonding Agent Layer #A1 at the dry thickness of 20 μm, and the plastic plate.

<Composition of Bonding Agent Layer #A1>

200 cc of toluen, 50 g of methylmethacrylate (MMA), 5 g of ethylmethacrylate (AMA), 5 g of acrylamide (AM) and 250 mg of AIBN were charged into a three neck flask of 500 cc capacity carrying a thermometer, a cooling tube and a nitrogen introduction tube, and the mixture was stirred at 100° C. for three hours at reflux while bubbling with nitrogen. Following a precipitation process using methanol, the obtained polymer was filtered, and after a vacuum drying process, methacrylic acid ester was synthesized. The yield of 75 weight %. This consisted the main component of Bonding Agent Layer #A1.

| | |
|---|---|
| methacrylic acid ester (MMA/EMA/AM = 88/9/3, Mw = 700,000) | 100 weight parts |
| SIR-159 (Infrared Absorbing Agent #A1; Mitsui Toatsu Kagaku KK) | 0.5 weight parts |
| toluen | 450 weight parts |
| ethyl acetate | 10 weight parts |

After drying the solvent, the composition of Bonding Agent Layer #A1 had a refractive index of 1.48, and a softening temperature of 105° C.

<Example #A2>

<Electromagnetic Shielding Bonding Film #A2 and Electromagnetic Shielding Assembly #A2>

The plastic film consisted of transparent polyethyleneterephthalate (PET) film having the thickness of 25 μm. Bonding Agent Layer #A2 containing an infrared absorbing agent which is described hereinafter was applied on one side of this plastic film to a prescribed dry thickness at room temperature by using an applicator, and was heated and dried at 90° C. for 20 minutes. An aluminum foil having the thickness of 25 μm was laminated over the surface of Bonding Agent Layer #A2, and was laminated by heating, under the condition of 130° C. and 20 kgf/cm² to obtain PET film carrying aluminum foil. The obtained PET film laminated with aluminum foil is subjected to a photo-lithographic process similarly as Electromagnetic Shielding Bonding film #A1 and Electromagnetic Shielding Assembly #A1, and an aluminum grid pattern having the line width of 15 μm and the line spacing of 125 μm was formed on the surface of the PET film to obtain Electromagnetic Shielding Bonding Film #A2. The visible light transmission factor of Electromagnetic Shielding Bonding Film #A2 was 20% or less. Thereafter, Electromagnetic Shielding Bonding Film #A2 was applied over the surface of commercially available acrylic plate (marketed by KK Kurare under the tradename of Komoglass, thickness 3 mm) by using a thermal press, with the bonding layer facing the acrylic plate, under the temperature and pressure condition of 120° C., 30 kgf/cm² and 30 minutes to obtain Electromagnetic Shielding Assembly #A2.

Example #A2 consisted of Electromagnetic Shielding Assembly #A2 which was formed by combining Electromagnetic Shielding Bonding Film #A2 carrying Bonding Agent Layer #A2 at the dry thickness of 40 μm, and the plastic plate.

<Composition of Bonding Agent Layer #A2>

| | |
|---|---|
| TBA-HME (Hitachi Kasei Kogyo KK; high polymer epoxy resin, Mw = 300,000) | 100 weight parts |
| UFP-HX (Infrared Absorbing Agent #A2; Sumitomo Kinzoku Kozan KK, ITO, average particle diameter 0.1 μm) | 0.4 weight parts |
| MEK | 330 weight parts |
| cyclohexane | 15 weight parts |

After drying the solvent, the composition of Bonding Agent Layer #A2 had a refractive index of 1.57, and a softening temperature of 79° C.

\<Example #A3\>

\<Electromagnetic Shielding Bonding Film #A3 and Electromagnetic Shielding Assembly #A3\>

Bonding Agent Layer #A3 containing an infrared absorbing agent which is described hereinafter was applied on one side of PET Elm having the thickness of 50 μm at room temperature by using an applicator, and was heated and dried at 90° C. for 20 minutes. Electroless nickel plating was formed over the surface of Bonding Agent Layer #A3 in a grid pattern by using a mask so as to achieve a line width of 10 μm, a line sparing of 100 μm and a line thickness of 1 μm to obtain Electromagnetic Shielding Bonding Film #A3 consisting of PET film carrying nickel in a grid pattern. The visible light transmission factor of Electromagnetic Shielding Bonding Film #A3 was 20% or less. Thereafter, Electromagnetic Shielding Bonding Film #A3 was applied over the surface of commercially available acrylic plate (marketed by KK Kurare under the tradename of Komoglass, thickness 3 mm) by using a roll laminator, with the bonding layer facing the acrylic plate, under the temperature and pressure condition of 110° C., and 20 kgf/cm² to obtain Electromagnetic Shielding Assembly #A3.

Example #A3 consisted of Electromagnetic Shielding Assembly #A3 which was formed by combining Electromagnetic Shielding Bonding Film #A3 carrying Bonding Agent Layer #A3 at the dry thickness of 5 μm, and the plastic plate.

\<Composition of Bonding Agent Layer #A3\>

| | |
|---|---|
| Pyron UR-1400 (Toyo Boseki KK, saturated polyester resin, Mw = 40,000) | 100 weight parts |
| IRG-002 (Infrared Absorbing Agent #A3; Nihon Kayaku KK, aluminum compound) | 1.2 weight parts |
| MEK | 285 weight parts |
| cyclohexane | 5 weight parts |

After drying the solvent, the composition of Bonding Agent Layer #A3 had a refractive index of 1.55, and a softening temperature of 83° C.

\<Example #A4\>

Polyacrylic acid ester which was the man component of Bonding Agent Layer #A1 was replaced with methyl methacrylate (MMA)/ethyl methacrylate (AMA)/acrylamide (AM)=85/10/5, and as a result of identical synthesis process polyacrylic acid ester of Mw=550,000 was obtained. Bonding Agent Layer #A3 had the same composition as Bonding Agent Layer #A1 besides this polyacrylic acid ester, and Example #A4 consisted of Electromagnetic Shielding Assembly #A4 which was formed identically as Example #A1 was formed from Electromagnetic Shielding Assembly #A1 and Electromagnetic Shielding Bonding Film #A4. After drying the solvent the composition of Bonding Agent Layer #A4 had a refractive index of 1.47, and a softening temperature of 99° C.

\<Example #A5\>

Polyacrylic acid ester which was the main component of Bonding Agent Layer #A1 of Example #A1 was replaced with polybutadiene elastomer (marketed by Idemitsu Sekiyu Kagaku KK under the tradename of Poly bd R-45III) to obtain the composition for Bonding Agent Layer #A5, and Example #A5 consisted of Electromagnetic Shielding Assembly #A5 which was formed identically as Example #A1 except for this change in Bonding Agent Layer #A5. After drying the solvent, the composition of Bonding Agent Layer #A5 had a refractive index of 1.50, and a softening temperature of 61° C.

\<Example #A6\>

Polyacrylic acid ester which was the main component of Bonding Agent Layer #A1 of Example #A1 was replaced with Pyron-200 (marketed by Toyo Boseki KK, Mn=15,000, linear saturated polyester resin) to obtain the composition for Bonding Agent Layer #A6, and Example #A6 consisted of Electromagnetic Shielding Assembly #A6 which was formed was formed identically as Example #A1 except for this change in Bonding Agent Layer #A6. After drying the solvent, the composition of Bonding Agent Layer #A6 had a refractive index of 1.55, and a softening temperature of 163° C.

\<Example #A7\>

Example #A7 consisted of Electromagnetic Shielding Assembly #A7 which was identically prepared as Example #A2 except for that the plastic film consisted of polycarbonate film (50 dims n=1.58) instead of PET film (50 μm) and the thickness of Bonding Agent Layer #A2 was 30 μm instead of 40 μm.

\<Example #A8\>

Example #A8 consisted of Electromagnetic Shielding Assembly #A8 which was identically prepared as Example #A3 except for that the line width was 30 μm instead of 10 μm, the line spacing was 500 μm instead of 100 μm, and the bonding layer thickness was 10 μm instead of 5 μm.

\<Example #A9\>

Example #A9 consisted of Electromagnetic Shielding Assembly #A9 which was identically prepared as Example #A1 except for that the copper grid pattern formed on the PET film by the photo-lithographic process was darkened.

\<Comparative Example #A1\>

The composition for Bonding Agent Layer #A7 consisted of the following composition, and Comparative Example #A1 consisted of Electromagnetic Shielding Assembly #A10 made by using Bonding Agent Layer #A7. Polyacrylic aced ester was synthesized under the same condition as that used for the main component of Bonding Agent Layer #A1 of Example #A1 (BA: butylacrylate, HEA: hydroxyethyacrylate)

\<Composition of Bonding Agent Layer #A7\>

| | |
|---|---|
| polycrylic acid ester (MMA/BA/HEM = 85/10/5, Mw = 550,000) | 100 weight parts |
| Colonate L (Nihon Polyurethane Kogyo KK, 3-functional isocyanate) | 3.5 weight parts |
| SIR-159 (Infrared Absorbing Agent #A1; Mitsui Toatsu Kagaku KK) | 0.5 weight parts |
| toluen | 450 weight parts |
| ethyl acetate | 10 weight parts |

After drying the solvent, the composition had a refractive index of 1.48, and a softening temperature of 200° C. or higher.

\<Comparative Example #A2\>

The composition for Bonding Agent Layer #A8 consisted of the following composition, and Comparative Example #A2 consisted of Electromagnetic Shielding Assembly #A11 made by using Bonding Agent Layer #A8. Conditions were otherwise identical to those of Example #A2.

\<Composition of Bonding Agent Layer #A8\>

| | |
|---|---|
| YD-8125 (Toto Kasei Kogyo KK; bisphenol type A epoxy resin, Mw = 300,000) | 100 weight parts |
| IPDI (Hitachi Kasei Kogyo KK; mask isophorone-di-isocyanate) | 12.5 weight parts |
| 2-ethyl-4-methylimidazole | 0.3 weight parts |
| UFP-HX (Infrared Absorbing Agent #A2; Sumitomo Kinzoku Kozan KK, ITO, average particle diameter 0.1 $\mu$m) | 0.4 weight parts |
| MEK (methyl-ethyl-ketone) | 330 weight parts |
| cyclohexanone | 15 weight parts |

After drying the solvent, the composition had a refractive index of 1.57, and a softening temperature of 200° C. or higher.

\<Comparative Example #A3\>

Pyron UR-1400 of Bonding Agent Layer A3 of Example #A3 was replaced with phenol-formaldehyde resin (Mw=50,000) to obtain Bonding Agent Layer #A9. Comparative Example #A3 consisted of Electromagnetic Shielding Assembly #A12 made by using Bonding Agent Layer #A9. Conditions were otherwise identical to those of Example #A2. After drying the solvent, Bonding Agent Layer #A9 has a refractive index of 1.73, and a softening temperature of 85° C.

\<Comparative Example #A4\>

Comparative Example #A4 consisted of Electromagnetic Shielding Assembly #A13 which was prepared identically as Example #A1 except for that the bonding layer thickness was 5 $\mu$m instead of 25 $\mu$m.

\<Comparative Example #A5\>

Comparative Example #A5 consisted of Electromagnetic Shielding Assembly #A14 which was prepared identically as Example #A1 except for that the line spacing was 50 $\mu$m instead of 250 $\mu$m.

\<Comparative Example #A6\>

Comparative Example #A6 consisted of Electromagnetic Shielding Assembly #A15 which was prepared identically Example #A1 except for that the line width was 50 $\mu$m instead of 25 $\mu$m and the line spacing was 150 $\mu$m instead of 250 $\mu$m.

\<Comparative Example #A7\>

Comparative Example #A7 consisted of Electromagnetic Shielding Assembly #A16 which was prepared identically as Example #A2 except for that the infrared absorbing agent was removed from Bonding Agent Layer #A2.

\<Comparative Example #A8\>

Comparative Example #A8 consisted of Electromagnetic Shielding Assembly #A17 which was prepared identically as Example #A1 except for that the electroconductive material consisted of ITO uniformly vapor deposited over the surface of the PET film to the thickness of 0.1 $\mu$m (1,000Å) without geometric patterning, and the infrared absorbing agent as removed from the composition of Bonding Agent Layer #A1 which as directly applied to the sure of the electroconductive material.

\<Comparative Example #A9\>

Comparative Example #A9 consisted of Electromagnetic Shielding Assembly #A18 which was prepared identically as Example #A3 except for that polydimethylsiloxane (Mw=45,000, n=1.43) was used as Bonding Agent Layer #A10. The conditions were otherwise identical to those of Example #A3.

The aperture ratio of the geometric pattern of the electroconductive metallic material formed over the electromagnetic shielding bonding film, EMI shielding performance, visible light transmission factor, invisibility, infrared blocking ratio, and bonding force before and after heating were actually measured, and the measured results are summarized in Tables 1 and 2.

The refractive index was measured by using a refraction meter (marketed by KK Atago Kogaku Kikai Seisakusho under the tradename of Abbe refraction meter) at the temperate of 25° C. The aperture ratio of the geometric pattern of the electroconductive metallic material formed over the electromagnetic shielding bonding film was actually measured from the microscopic photograph.

The EMI shielding performance was measured by placing the specimen between two flanges of a coaxial waveguide converter (marketed by Nihon Koshuha KK under the tradename of TWC-S-024), and using a spectro-analyzer (marketed by YHP under the tradename of 8510 B Vector Network Analyzer) over the frequency range of 30 MHz to 1 GHz.

The visible light transmission factor was measured as an average value of the transmission factor over the wavelength range of 400 to 700 nm by using a double beam spectrophotoanalyzer (marketed by KK Hitachi under the tradename of Type 200-10).

The invisibility was measured by viewing the electromagnetic shielding assembly incorporated with the electromagnetic shielding bonding film at the distance of 0.5 m, and evaluating if the geometric pattern of the electroconductive metallic material was visible or not. The specimens were graded into "good" and "NG" depending on if the pattern was visible or not.

The infrared blocking ratio was measured as an average value of the infrared absorption ratio for the wavelength range of 900 to 1,100 nm by using a spectrophotometer (marketed by KK Hitachi Seisakusho under the tradename of U-3410). The bonding force was measured by using a tensile strength testing machine (marketed by Toyo Baldwin KK under the tradename of Tensilon UTM-4-100) with the width of 10 mm, 90 degree direction and peeling speed of 50 mm/minute.

4480-1

| category | Examples items | #A1 | #A2 | #A3 | #A4 | #A5 | #A6 | #A7 | #A8 | #A9 |
|---|---|---|---|---|---|---|---|---|---|---|
| structure | Bonding Agent Composition | #A1 | #A2 | #A3 | #A4 | #A5 | #A6 | #A2 | #A3 | #A1 |
| | Infrared Absorbing Agent | #A1 | #A2 | #A3 | #A1 | #A1 | #A1 | #A2 | #A3 | #A1 |
| | bonding layer thickness ($\mu$m) | 20 | 40 | 5 | 20 | 20 | 20 | 30 | 10 | 20 |
| | conductive material thickness ($\mu$m) | Cu(12) | Al(25) | Ni(1) | Cu(12) | Cu(12) | Cu(12) | Al(25) | Ni(1) | Cu(12) darkened |
| | plastic film thickness ($\mu$m) | PET(50) | PET(25) | PET(60) | PET(60) | PET(60) | PET(60) | polpcarbonate (50) | PET(50) | PET(50) |
| | line width spacing ($\mu$m) patterning method | 25–250 chemical etching | 15–125 chemical etching | 10–100 plating | 25–250 chemical etching | 25–250 chemical etching | 25–250 chemical etching | 16–125 chemical etching | 30–500 plating | 26–250 chemical etching |
| property | aperture ratio (%) | 81 | 77 | 80 | 81 | 81 | 81 | 77 | 88 | 81 |
| | EMI shield (dB) | 47 | 55 | 80 | 47 | 47 | 47 | 55 | 37 | 47 |
| | visible light transmission factor (%) | 86 | 62 | 85 | 65 | 86 | 64 | 84 | 77 | 66 |
| | invisibility | good | good | good | good | good | good | good | good | good |
| | infrared blocking property (%) | 76 | 70 | 82 | 75 | 76 | 76 | 71 | 80 | 75 |
| | initial bonding force (kgf/cm$^2$) | 1.1 | 1.7 | 1.3 | 1.1 | 1.2 | 1.5 | 1.7 | 1.3 | 1.2 |
| | bonding force after 80° C. 100 hrs of aging (kgf/cm$^2$) | 1.0 | 1.7 | 1.4 | 1.0 | 1.2 | 1.5 | 1.7 | 1.4 | 1.1 |

4480-2

| category | Comparative Examples items | #A1 | #A2 | #A3 | #A4 | #A5 | #A6 | #A7 | #A8 | #A9 |
|---|---|---|---|---|---|---|---|---|---|---|
| structure | Bonding Agent Composition | #A7 | #A8 | #A9 | #A1 | #A1 | #A1 | #A2 | — | 10 |
| | Infrared Absorbing Agent | #A1 | #A2 | #A3 | #A1 | #A1 | #A1 | none | none | 3 |
| | bonding layer thickness ($\mu$m) | 20 | 40 | 5 | 5 | 20 | 20 | 40 | — | 5 |
| | conductive material thickness ($\mu$m) | Cu(12) | Al(25) | Ni(1) | Cu(12) | Cu(12) | Cu(12) | Al(25) | ITO(0.1) | Ni(1) |
| | plastic film thickness ($\mu$m) | PET(50) | PET(25) | PET(50) | PET(50) | PET(50) | PET(50) | PET(25) | PET(50) | PET(5) |
| | line width spacing ($\mu$m) patterning method | 25–250 chemical etching | 15–125 chemical etching | 10–100 plating | 25–260 chemical etching | 25–260 chemical etching | 50–150 chemical etching | 15–125 chemical etching | — uniform vapor deposition | 10–100 plating |
| property | aperture ratio (%) | 81 | 77 | 80 | 81 | 25 | 44 | 77 | — | 80 |
| | EMI shield (dB) | 47 | 56 | 60 | 47 | 62 | 56 | 55 | <20 | 60 |
| | visible light transmission factor (%) | <20 | <20 | 25 | 29 | <20 | 33 | 70 | 70 | 29 |
| | invisibility | NG | NG | NG | NG | NG | NG | good | good | NG |
| | infrared blocking property (%) | NA due to excessive dispersion | NA due to excessive dispersion | NA due to excessive dispersion | NA due to excessive dispersion | 90 | 89 | <20 | <20 | NA due to excessive dispersion |
| | initial bonding force (kgf/cm$^2$) | <0.2 | <0.2 | 1.8 | 1.1 | 1.1 | 1.1 | 1.7 | — | 1.2 |
| | bonding force after 80° C. 100 hrs of aging (kgf/cm$^2$) | <0.2 | <0.2 | 1.4 | 1.0 | 1.0 | 1.0 | 1.7 | — | 1.2 |

According to Comparative Examples #A1 and #A2, the softening temperature of the bonding agent layer was 200° C. or higher, and because the bonding agent layer lacked fluidity, and was unable flow more than the thickness of the geometrically patterned electroconductive metallic material such as copper foil and aluminum foil, the bonding agent layer failed to closely attach to the plastic plate of the bonding object. As a result, the bonding force was inadequate. Also, the irregular surface texture imprinted on the surface of the bonding agent layer remained permanently due to the lack of fluidity, and the resulting irregular dispersion of the transmission light causes a low visible transmission factor. According to Comparative Example #A3, Bonding Agent Layer #A9 had a high refraction index of 1.73, and the excessive scattering of light at the interface between the bonding agent layer and the plastic plate resulted in a low visible light transmission factor. According to Comparative Example #A4, because the thickness of 5 μm of Bonding Agent Layer #A1 was smaller than the thickness of 12 μm of the copper foil, a favorable attachment between Bonding Agent Layer #A1 and the plastic plate was achieved owing to the fluidity of Bonding Agent Layer #A1, but the failure to completely embed the electroconductive metallic material in the bonding agent layer resulted in a poor visible light transmission factor. According to Comparative Example #As, a favorable EMI shielding was achieved owing to the line spacing of 50 μm, and a favorable invisibility was attained owing to the fine line width of 25 μm, but the narrow line spacing resulted in a poor visible light transmission factor due to the small aperture ratio of 25% which is substantially smaller than the desired minimum of 50%. According to Comparative Example #A6, a poor invisibility resulted because of the large line width of 50 μm. According Comparative Example #A7 which used a bonding agent layer containing no infrared absorbing agent, a poor infrared blocking resulted. According Comparative Example #A8 which used ITO (indium-tin oxide) vapor deposited on PET film, the EMI shielding was poor. According Comparative Example #A9 which used Bonding Agent Layer 10 having the refractive index of 1.43 for the bonding agent layer, because of excessive scattering of light at the interface between the bonding agent layer and the plastic plate similarly as Comparative Example #A3, a poor visible light transmission factor resulted. As opposed to these Comparative Examples, Examples of the present invention which are characterized by an electroconductive metallic material layer which is geometrically patterned by microlithography so as to have an aperture ratio of 50% or more, and the bonding agent layer which has a softening temperature of 200° C. or lower and a refractive index of 1.45 to 1.70, the bonding agent layer having a larger thickness than the electroconductive metallic material, and containing an infrared absorbing agent, all the measured values were satisfactory. Particularly favorable results were obtained when the electroconductive metallic material had a line width of 40 μm or less, a line spacing of 100 μm or more and a line thickness 40 μm or less. The electromagnetic shielding assembly of Example #A9 using darkened copper allowed a high contrast and clear images to be viewed.

Now is described another aspect of the present invention in which the bonding agent composition cures or solidifies by radiation of active radiation energies such as infrared or electron beam radiation, and is preferably cured after the electromagnetic shielding bonding film essentially consisting of geometrically patterned electroconductive material, a bonding layer, and plastic film is attached to a bonding object such as a display device or a plastic plate. It is also possible to allow the bonding agent layer to partly cure by active energy radiation before the bonding film is attached to the bonding object. In this case, the viscosity of the bonding agent layer after this partly curing process should be 10,000 poise or less as measured by a rotary viscometer at 200° C. This because the bonding agent layer is required to retain a certain fluidity even after this partial curing process for the bonding agent layer to be capable of attaching to the bonding object. It is also possible that the bonding agent layer retains a certain fluidity and bonding property even after the bonding agent has fully cured.

The bonding agent compositions which can be used for such a bonding agent layer which cures by active radiation energy such as ultraviolet or electron beam radiation energy include such base polymers as acrylic resin, epoxy resin, polyester resin, and urethane resin having radical polymerizing functional groups or cationic polymerizing function groups attached thereto.

Such radical polymerizing functional groups may include carbon— carbon double bond groups such as acrylic (acryloil) groups, methacryl (methacryloil) groups, vinyl groups, and aryl groups. In particular, acrylic (acryloil) groups are preferred because of their high reactivity.

Such cationic polymerizing function groups typically consist of epoxy (glycidylether, glycidylamin) groups, and alicyclic epoxy groups are particularly preferred because of their high reactivity. Typical materials of this type include acryl-urethane, epoxy(metha)acrylate, epoxy denatured polyester, polybutadiene(metha)acrylate, and acryl denatured polyester.

When the active radiation energy consists of ultraviolet radiation, the photosensitizer or the photoinitiatior may consist of any known materials such as benzophenone, antraquinone, benzoin, sulfonium sale diazonium salt, onium salt and halonium salt compounds.

The above materials may be mixed with common thermoplastic resins. Such thermoplastic resins may include dienes such as natural rubber (refraction index: n=1.52), polyisoprene (n=1.521), poly-1,2-butadiene (n=1.50), poly-isobutane (n=1.505 to 1.51), polybutane (n=1.513), poly-2-heptyl-1,3-butadiene (n=1.50), poly-2-t-butyl-1,3-butadiene (n=1.506) and poly-1,3-butadiene (n=1.515), polyethers such as polyoxy-ethylene (n=1.456), polyoxy-propylene (n=1.450), polyvinyl-ethylether (n=1.454), polyvinyl-hexylether (n=1.459) and polyvinyl-butylether (n=1.456), polyesters such as polyvinyl-acetate (n=1.467), and polyvinyl-propionete (n=1.467), polyurethane (n=15 to 1.6), ethylcellulose (n=1.479), polyvinyl-chloride (n=1.54 to 1.55), polyacrylonitrile (n=1.52), polymethacrylonitrile (n=1.52), polysulfone (n=1.633), polysulfide (n=1.6) phenoxy resin (n=1.5 to 1.6), and poly (metha) acrylic acid esters such as polyethyl-acrylate (n=1.4685), polybutyl-acrylate (n=1.466), poly-2-ethylhexyl-acrylate (n=1.463), poly-t-butyl-acrylate (n=1.4638), poly-3-ethoxypropyl-acrylate (n=1.465), polyoxycarbonyl-tetramethacrylate (n=1.465), polymethyl-acrylate (n=1.472 to 1.480), polyisopropyl-methacrylate (n=1.473), polydodecil-methacrylate (n=1.474), polytetradecil-methacrylate (n=1.475), poly-n-propyl-methacrylate (n=1.484), poly-3,3,5-trimethyl-cyclohexyl-methacrylate (n=1.484), polyethyl-methacrylate (n=1.485), poly-2-nitro-2-methylpropyl-methacrylate (n=1.487), poly-1,1-diethylpropyl-methacrylate (n=1.489), and polymethyl-methacrylate (n=1.489). Two or more these acrylic polymers may be copolymerized, or may be mixed together as required.

Copolymers of acrylic resin and other resin materials may also be used, and they inlcude epoxyacrylates (n=1.48 to 1.60), urethaneacrylates (n=1.5 to 1.6), polyetheracrylates (n=1.48 to 1.49), and polyesteracrylates (n=1.48 to 1.54). In terms of bonding property, urethaneacrylates, epoxyacrylates and polyetheracrylates arc particularly desirable. Such epoxyacrylates include (metha)acrylic acid derivatives such as 1,6-hexandiol-diglycidylether, neopenthylglycol-diglycidylether, arylalcohol-diglycidylether, resorcinol-diglycidylether, diglycidylester adipate, diglycidylester phthalate, polyethyleneglycol-diglycidylesther, trimethylolpropane-triglycidylether, glycerin-triglycidylether, pentaerythritol-tetraglycidylether, and sorbitol-tetraglycidylether. Epoxyacrylates are effective in improving bonding property as they contain hydroxyl groups in their molecules, and these copolymers can be used either individually or in combination. The softening temperature of the polymer that can be used for the bonding agent of the present invention is preferably 200° C. or lower for the convenience of handling, and is even more preferable if it 150° C. or lower. Because such electromagnetic shielding bonding film is normally used in the environments of 80° C. or lower, in view of the workability, the most preferred range of the softening temperature is 80 to 120° C. The weight-average molecular weight of the main polymer in the bonding agent should be 500 or greater. If the molecular weight is less than 500, the cohesive force of the composition is so small that a satisfactory attachment to the object may not be achieved.

A diluting agent, plasticizer, anti-oxidixation agent, filer, coloring agent, UV absorbing agent, and viscosity increasing agent may be added to the bonding agent composition as required.

The refractive index of the bonding agent layer which cures by active radiation energy is preferably in the range of 1.45 to 1.70. This is because if there is any significant difference in refraction index between the plastic film and the bonding agent which are used in the invention, and the bonding agent of the present invention and the bonding agent which is used for attaching electroconductive metallic material to the plastic film, the visible light transmission factor drops. However, if the refractive index is in the range of 1.45 to 1.70 such a drop in the visible light transmission factor can be avoided, and the polymers mentioned above all fall within this range.

According to present invention tie electromagnetic shielding bonding film may essentially consists of a bonding agent layer which cures by active radiation energy, geometrically patterned electroconductive metallic material and plastic film. The electroconductive metallic material preferably consists of metal foil, and in such a case, the bonding surface of the metallic foil is typically made into a coarse surface so as to achieve a desired bonding strength. When the electroconductive metallic material is geometrically patterned, the part of the surface of the bonding layer from which the electroconductive metallic material has been removed presents an irregular surface because the marks of the reverse surface of the electroconductive metallic material were imprinted on the surface of the bonding layer, and the resulting irregular reflection of visible light on the surface may damage the transparency of the plastic film. It may also the ease that the surface of the plastic film may be intentionally given with an irregular texture by adding a small amount of filler with the aim of improving tie molding result and reducing the friction of the film to facilitate the winding of the plastic film into a roll, and by applying a matte process to increase the bonding force of the bonding agent. The transparency of the plastic film may be thus damaged by the irregular surface texture in the part of the surface of the plastic film from which the electroconductive material has been removed or the plastic film itself due to the intentional surface roughening process to improve the bonding property and due to the imprinting of the surface texture of the reverse surface of the electroconductive metallic material. However, the bonding layer of the present invention which cures by active radiation energy fills such irregular surface textures because it is highly fluid owing to the lack of any crosslinking or curing structure, and in particular, when resin material having a refraction index close to that of the plastic film is smoothly coated over the surface, irregular surface reflection can be minimized. Once the bonding agent layer cures by active energy radiation, a highly heat-resistant bonding layer can be obtained. The geometrically patterned electroconductive metallic material on the film surface has such a small line width that it is virtually invisible to naked eyes. Also, because of the sufficient large spacing, an apparent transparency can be attained. However, the line spacing of the geometric pattern is sufficiently small than the wavelength of the electromagnetic radiation which is to be shielded so that a favorable shielding property can be achieved.

<Example #B1>

<Electromagnetic Shielding Bonding Film 6190 B1 and Electromagnetic Shielding Assembly #B1>

The plastic film consisted of transparent polyethyleneterephthalate (PET) film having the thickness of 50 μm (marketed by Toyo Boseki KK under the tradename of A-4100, refraction index n=1,575). Bonding Agent Layer #B1 containing an infrared absorbing agent which is described hereinafter was applied on one side of this plastic film to a prescribed dry thickness at room temperature by using an applicator, and was heated and dried at 90° C. for 20 minutes. An electrolytic copper foil having the thickness of 12 μm serving as the electroconductive metallic material was laminated over the surface of Bonding Agent Layer #B1 with its coarse surface facing the bonding layer, and was laminated by heating, under the condition of 180° C. and 30 kgf/cm2 to obtain PET film carrying copper foil as plastic film carrying electroconductive material.

The obtained PET film laminated with copper foil is subjected to a photo-lithographic process (including the steps of resist film coating, photographic exposure, photographic development, chemical etching, and resist film removal), and a copper grid pattern having the line width of 25 μm and the line spacing of 250 μm was formed on the surface of the PET film to obtain Electromagnetic Shielding Bonding Film #B1. The visible light transmission factor of Electromagnetic Shielding Bonding Film #B1 was 20% or less. Thereafter, Electromagnetic Shielding Bonding Film #B1 was applied over the surface of commercially available acrylic plate (marketed by KK Kurare under the tradename of Komoglass, thickness 3 mm, n=1.49) by using a thermal press, with the bonding layer facing the acrylic plate, under the temperature and pressure condition of 110° C., 20 kgf/cm² and 15 minutes, and the bonding agent layer was caused to cure by radiating infrared from the side of the PET film at the intensity of 3 J/cm² by using an infrared radiating device to obtain Electromagnetic Shielding Assembly #B1.

Example #B1 consisted of Electromagnetic Shielding Assembly #1 which was formed by combining Electromagnetic Shielding Bonding Film #B1 carrying Bonding Agent Layer #B1 at the dry thickness of 20 μm, and the plastic plate.

<Composition of Bonding Agent Layer #1>

| | |
|---|---|
| Pyron BK-4103 (Toyo Boseki KK, acryl denatured polyester resin, Mn = 40,000) | 100 weight parts |
| SIR-159 (Infrared Absorbing Agent #B1; Mitsui Toatsu Kagaku KK) | 0.5 weight parts |
| benzophenon (Wako Junyaku Kogyo KK) | 5 weight parts |
| toluen | 450 weight parts |
| ethyl acetate | 10 weight parts |

After drying the solvent, the composition of Bonding Agent Layer #31 had a refractive index of 1.52, and a viscosity of 1,500 poise at 200° C.

<Example #B2>

<Electromagnetic Shielding Bonding Film #B2 and Electromagnetic Shielding Assembly #B2>

The plastic film consisted of transparent polyethyleneterephthal ate (PET) film having the thickness of 25 µm. Bonding Agent Layer #B2 containing an infrared absorbing agent which is described hereinafter was applied on one side of this plastic film to a prescribed dry thickness at room temperature by using an applicator, and was heated and dried at 90° C. for 20 minutes. An aluminum foil having the thickness of 25 µm was laminated over the surface of Bonding Agent Layer #B2, and was laminated by heating, under the condition of 130° C. and 20 kgf/cm² to obtain PET film carrying aluminum foil. The obtained PET film laminated with aluminum foil is subjected to a photolithographic process similarly as Electromagnetic Shielding Bonding Film #1 and Electromagnetic Shielding Assembly #B1, and an aluminum grid pattern having the line width of 15 µm and the line spacing of 125 µm was formed on the surface of the PET film to obtain Electromagnetic Shielding Bonding Film #B2. The visible light transmission factor of Electromagnetic Shielding Bonding Film #B2 was 20% or less. Thereafter, Electromagnetic Shielding Bonding Film #B2 was applied over the surface of commercially available acrylic plate (marketed by KK Kurare under the tradename of Komoglass, thickness 3 mm) by using a thermal press, with the bonding layer facing the acrylic plate, under the temperature and pressure condition of 120° C., 30 kgf/cm² and 30 minutes, and the bonding agent layer was caused to cure by radiating infrared from the side of the PET film at the intensity of 3 J/cm² by using an infrared radiating device to obtain Electromagnetic Shielding Assembly #B2.

Example #B2 consisted of Electromagnetic Shielding Assembly #B2 which was formed by combining Electromagnetic Shielding Bonding Film #B2 carrying Bonding Agent Layer #B2 at the dry thickness of 40 µm, and the plastic plate.

<Composition of Bonding Agent Layer #B2>

| | |
|---|---|
| Pyron EP-2940 (Toyo Boseki KK, epoxy denatured polyester resin, Mn = 40,000) | 100 weight parts |
| UFP-HX (Infrared Absorbing Agent #B2; Sumitomo Kinzoku Kozan KK, ITO, average particle diameter 0.1 µm) | 0.4 weight parts |
| Silacure UVI-6070 (Union Carbide Japan KK, aromatic sulfonium salt compound) | 5 weight parts |
| MEK | 330 weight parts |
| cyclohexane | 15 weight parts |

After drying the solvent, the composition of Bonding Agent Layer #B2 had a refractive index of 1.54, and a viscosity of 1,200 poise at 200° C.

<Example #B3>

Electromagnetic Shielding Bonding Film #3 and Electromagnetic Shielding Assembly #B3>

Bonding Agent Layer #3 which is described hereinafter was applied on one side of PET film having the thickness of 50 µm at room temperature by using an applicator, and was heated and dried at 90° C. for 20 minutes. Electroless nickel plating was formed over the surface of Bonding Agent Layer #B3 in a grid pattern by using a mask so as to achieve a line width of 10 µm, a line spacing of 100 µm and a line thickness of 1 µm to obtain Electromagnetic Shielding Bonding Film #B3 consisting of PET film carrying nickel in a grid pattern.

The visible light transmission factor of Electromagnetic Shielding Bonding Film #B3 was 20% or less. Thereafter, Electromagnetic Shielding Bonding Film #B3 was applied over the surface of commercially available acrylic plate (marketed by KK Kurare under the tradename of Komoglass, thickness 3 mm) by using a roll laminator, with the bonding layer facing the acrylic plate, under the temperature and pressure condition of 110° C., and 20 kgf/cm², and the bonding agent layer was caused to cure by radiating infrared from the side of the PET film at the intensity of 3 J/cm² by using an infrared radiating device to obtain Electromagnetic Shielding Assembly #B3.

Example #B3 consisted of Electromagnetic Shielding Assembly #B3 which was formed by combing Electromagnetic Shielding Bonding Film #B3 carrying Bonding Agent Layer #B3 at the dry thickness of 5 µm, and the plastic plate.

<Composition of Bonding Agent Layer #B3>

| | |
|---|---|
| Polypeck R-45ACR-LC (Idemitsu Sekiyu Kagaku KK, acrylonitrile denatured polybutadiene resin) | 100 weight parts |
| IRG-002 (Infrared Absorbing Agent #B3; Nihon Kayaku KK, aminium compound) | 1.2 weight parts |
| benzophenone (Wako Junyaku Kogyo KK) | 5 weight parts |
| MEK | 285 weight parts |
| cyclohexane | 5 weight parts |

After drying the solvent, the composition of Bonding Agent Layer #B3 had a refractive index of 1.55, and a viscosity of 70 poise at 200° C.

<Example #B4>

In Electromagnetic Shielding Bonding Film #B3 and Electromagnetic Shielding Assembly #B1 of Example #B1, benzophenone was removed from the composition of Bonding Agent Layer #B1 to obtain Bonding Agent Layer #B4 having the composition given below. An electron beam, instead of ultraviolet radiation, was applied to Bonding Agent Layer #B4 from the side the PET film at the intensity of 5 Mrad to cure the same and obtain Electromagnetic Shielding Bonding Film #B4.

The composition of Bonding Agent Layer #B4 was applied to the dry thickness of 20 Am. Example #B4 consisted of Electromagnetic Shield Assembly 6190 B4 which was prepared by combining Electromagnetic Shielding Bonding Film #B4 with an acrylic plate in the same way as with Electromagnetic Shielding Bonding Film #B1.

<Composition of Bonding Agent Layer #B4>

| | |
|---|---|
| Pyron BK-4103 (Toyo Boseki KK, acryl denatured polyester resin, Mn = 40,000) | 100 weight parts |
| SIR-159 (Infrared Absorbing Agent #B1; Mitsui Toatsu Kagaku KK) | 0.5 weight parts |
| toluen | 450 weight parts |
| ethyl acetate | 10 weight parts |

After drying the solvent, the composition of Bonding Agent Layer #B4 had a refractive index of 1.52, and a viscosity of 1,500 poise at 200° C.

<Example #B5>

Bonding Agent Layer #35 having the composition given below was applied to the dry thickness of 20 µam. Example #B5 consisted of Electromagnetic Shielding Assembly #5 which was prepared by combining Electromagnetic Shielding Bonding Film #B5 with an acrylic plate in the same way as with Electromagnetic Shielding Bonding Film #B1 and Electromagnetic Shielding Assembly #1B4.

<Composition of Bonding Agent Layer #B5>

| | |
|---|---|
| BAC45 (Idemitsu Sekiyu Kagaku KK, direct acyloil denatured polybutadiene resin) | 100 weight parts |
| IRG-002 (Infrared Absorbing Agent #B3; Nihon Kayaku KK, aminium compound) | 1.2 weight parts |
| MEK | 285 weight parts |
| cyclohexane | 5 weight parts |

After drying the solvent, the composition of Bonding Agent Layer #B5 had a refractive index of 1.51, and a viscosity of 60 poise at 200° C.

<Example #B6>

Example #B6 consisted of Electromagnetic Shielding Assembly #6 which was identically prepared as Example #B2 except for that the plastic film consisted of polycarbonate film (50 μm, n=1.58) instead of PET film (50 μm) and the thickness of Bonding Agent Layer #B2 was 30 μm instead of 40 μm.

<Example #B7>

Example #B7 consisted of Electromagnetic Shielding Assembly #B7 which was identically prepared as Example #B3 except for that the line width was 30 μm instead of 10 μm, the line spacing was 500 μm instead of 100 μm, and the bonding layer thickness was 10 μm instead of 5

<Example #B8>

Example #B8 consisted of Electromagnetic Shielding Assembly #B8 which was identically prepared as Example #1 except for that the copper grid pattern formed on the PET film by the photo-lithographic process was darkened.

<Comparative Example #B1>

Comparative Example #B1 consisted of an electromagnetic shielding assembly made by using Bonding Agent Layer #B1. No radiation of active radiation energy was used, but the conditions were otherwise identical to those of Example #B1.

<Comparative Example #B2>

Bonding Agent Layer #B7 was obtained by replacing Polypeck R-45ACR-L of the composition of Bonding Agent Layer #B3 with phenol-formaldehyde resin (Mw=50,000). No radiation of active radiation energy was used, but the conditions were otherwise identical to those of Example #3B1 in obtaining Comparative Example #B2.

After drying the solvent, the composition of Bonding Agent Layer #B7 had a refractive index of 1.73, and a viscosity of 300 poise at 200°

<Comparative Example #B3>

Comparative Example #B3 consisted of an electromagnetic shielding assembly which was prepared identically as Example #B1 except for that the bonding layer thickness was 5 instead of 20 μm, and no radiation of active radiation energy was used.

<Comparative Example #B4>

Comparative Example #B4 consisted of an electromagnetic shielding assembly which was prepared identically as Example #31 except for that the line spacing was 50 μm instead of 250 μm, and no radiation of active radiation energy was used.

<Comparative Example #B5>

Comparative Example #B5 consisted of an electromagnetic shielding assembly which was prepared identically Example #B1 except for that the line width was 50 1m instead of 25 μm and the line spacing was 150 μm instead of 250 i and no radiation of active radiation energy was used.

<Comparative Example #B6>

Comparative Example #B6 consisted of an electromagnetic shielding assembly which was prepared identically as Example #32 except for that the infrared absorbing agent was removed from Bonding Agent Layer #B2, and no radiation of active radiation energy was used.

<Comparative Example #B7>

Comparative Example #37 consisted of an electromagnetic shielding assembly which was prepared identically as Example #B1 except for that the electroconductive material consisted of ITO uniformly vapor deposited over the surface of the PET film to the thickness of 0.1 μm (1,000Å) without geometric patterning, the infrared absorbing agent was removed from the composition of Bonding Agent Layer #B1 which was directly applied to the surface of the electroconductive material, and no radiation of active radiation energy was used.

<Comparative Example #B8>

Comparative Example #B8 consisted of an electromagnetic shielding assembly which was prepared identically as Example #B3 except for that polydimethylsiloxane (Mw=45,000, n=1.43) was used as Bonding Agent Layer #B10. The conditions were otherwise identical to those of Example #3.

The aperture ratio of the geometric pattern of the electroconductive metallic material formed over the electromagnetic shielding bonding film, EMI shielding performance, visible light transmission factor, invisibility, infrared blocking ratio, and bonding force before and after heating were actually measured, and the measured results are summarized in Tables 3 and 4.

The refractive index was measured by using a refraction meter (marketed by KK Atago Kogaku Kikai Seisakusho under the tradename of Abbe refraction meter) at the temperature of 25° C. The aperture ratio of the geometric pattern of the electroconductive metallic material formed over the electromagnetic shielding bonding film was actually measured from the microscopic photograph.

The EMI shielding performance was measured by placing the specimen between two flanges of a coaxial waveguide converter (marketed by Nihon Koshuha KK under the tradename of TWC-S-024), and using a spectro-analyzer (marketed by YHP under the tradename of 8510B Vector Network Analyzer) over the frequency range of 30 MHz to 1 GHz.

The visible light transmission factor was measured as an average value of the transmission factor over the wavelength range of 400 to 700 am by using a double beam spectrophotoanalyzer (marketed by KK Hitachi under the tradename of Type 200-10).

The invisibility was measured by viewing the electromagnetic shielding assembly incorporated with the electromagnetic shielding bonding film at the distance of 0.5 m, and evaluating if the geometric pattern of the electroconductive metallic material was visible or not. The specimens were graded into "good" and "NG" depending on if the pattern was visible or not.

The infrared blocking ratio was measured as an average value of the infrared absorption ratio for the wavelength range of 900 to 1,100 nm by using a spectrophotometer (marketed by KK Hitachi Seisakusho under the tradename of U-3410). The bonding force was measured by using a tensile strength testing machine (marketed by Toyo Baldwin KK under the tradename of Tensilon UTM-4-100) with the width of 10 mm, 90 degree direction and peeling speed of 50 mm/minute.

| category | Examples items | #B1 | #B2 | #B3 | #B4 | #B5 | #B6 | #B7 | #B8 |
|---|---|---|---|---|---|---|---|---|---|
| | | | | | 4490-1 | | | | |
| structure | Bonding Agent | #B1 | #B2 | #B3 | #B4 | #B5 | #B2 | #B3 | #B1 |
| | Composition Infrared Absorbing Agent | #B1 | #B2 | #B3 | #B1 | #B8 | #B2 | #B3 | #B1 |
| | bonding layer thickness ($\mu$m) | 20 | 40 | 5 | 20 | 20 | 30 | 10 | 20 |
| | conductive material thickness ($\mu$m) | Cu(12) | Al(25) | Ni(1) | Cu(12) | Cu(12) | Al(25) | Ni(1) | Cu(12) |
| | plastic film thickness ($\mu$m) | PET(50) | PET(50) | PET(50) | PET(50) | PET(50) | polycarbonate(50) | PET(50) | darkened PET(50) |
| | line width spacing ($\mu$m) | 25–250 | 15–125 | 10–100 | 25–250 | 25–260 | 15–125 | 30–500 | 25–250 |
| | patterning method | chemical etching | chemical etching | plating | chemical etching | chemical etching | chemical etching | plating | chemical etching |
| property | aperture ratio (%) | 81 | 77 | 80 | 81 | 81 | 77 | 88 | 81 |
| | EMI shield (dB) | 47 | 55 | 60 | 47 | 47 | 55 | 37 | 47 |
| | visible light transmission factor (%) | 66 | 62 | 65 | 65 | 66 | 64 | 77 | 66 |
| | invisibility | good | good | good | good | good | good | good | good |
| | infrared blocking property (%) | 76 | 70 | 82 | 75 | 76 | 71 | 80 | 75 |
| | initial bonding force (kgf/cm$^2$) | 1.3 | 1.5 | 1.0 | 1.6 | 1.1 | 1.4 | 1.0 | 1.6 |
| | bonding force after 80° C. 100 hrs of aging (kgf/cm$^2$) | 1.6 | 1.5 | 1.0 | 1.5 | 1.0 | 1.4 | 1.0 | 1.8 |
| | initial bonding force at 80° C.(kgf/cm$^2$) | 1.2 | 1.2 | 0.8 | 1.3 | 0.9 | 1.1 | 0.8 | 1.3 |

4490-2

| category | Comparative Examples items | #B1 | #B2 | #B3 | #B4 | #B5 | #B6 | #B7 | #B8 |
|---|---|---|---|---|---|---|---|---|---|
| structure | Bonding Agent Composition | #B1 | #B7 | #B1 | #B1 | #B1 | #B2 | — | 8 |
| | Infrared Absorbing Agent | #B1 | #B3 | #B1 | #B1 | #B1 | none | none | 8 |
| | bonding layer thickness ($\mu$m) | 20 | 5 | 5 | 20 | 20 | 40 | — | 5 |
| | conductive material thickness ($\mu$m) | Cu(12) | Ni(1) | Cu(12) | Cu(12) | Cu(12) | Al(25) | ITO(0.1) | Ni(1) |
| | plastic film thickness ($\mu$m) | PET(60) | PET(50) | PET(50) | PET(50) | PET(50) | PET(25) | PET(50) | PET(50) |
| | line width spacing ($\mu$m) | 25–250 | 10–100 | 26–250 | 26–250 | 50–150 | 15–125 | — | 10–100 |
| | patterning method | chemical etching | plating | chemical etching | chemical etching | chemical etching | chemical etching | uniform vapor deposition | plating |
| property | aperture ratio (%) | 81 | 80 | 81 | 25 | 44 | 77 | — | 80 |
| | EMI shield (dB) | 47 | 60 | 47 | 62 | 56 | 56 | <20 | 60 |
| | visible light transmission factor (%) | 66 | 25 | 29 | <20 | 33 | 70 | 70 | 29 |
| | invisibility | good | NG | NG | good | NG | good | good | NG |
| | infrared blocking property (%) | 76 | NA due to excessive dispersion | NA due to excessive dispersion | 90 | NA due to excessive dispersion | <20 | <20 | NA due to excessive dispersion |
| | initial bonding force (kgf/cm$^2$) | 1.0 | 1.3 | <0.2 | 1.6 | 1.6 | 1.5 | — | 1.2 |
| | bonding force after 80° C. 100 hrs of aging (kgf/cm$^2$) | 0.8 | 1.4 | <0.2 | 1.5 | 1.5 | 1.5 | — | 1.2 |
| | initial bonding force at 80° C.(kgf/cm$^2$) | 0.1 | 0.4 | 0.0 | 0.3 | 0.3 | 0.6 | — | 0.5 |

Comparative Example #B1 lacked the bonding force at 80° C. because the bonding agent layer was not crosslinked. According to Comparative Example #B2, the refractive index of Bonding Agent Layer was as high as 1.73 so that the resulting scattering of light at the interface between the bonding agent layer and the plastic plate resulted in a poor visible light transmission factor. According to Comparative Example #B3, because the thickness of 5 $\mu$m of Bonding Agent Layer #B1 was smaller than the thickness of 12 $\mu$m of the copper foil, a favorable attachment between Bonding Agent Layer #B1 and the plastic plate was achieved owing to the fluidity of Bonding Agent Layer #B1, but the failure to completely embed the electroconductive metallic material in the bonding agent layer resulted in a poor visible light transmission factor. According to Comparative Example #4, a favorable EMI shielding was achieved owing to the line spacing of 50 $\mu$m, and a favorable invisibility was attained owing to the fine line width of 25 $\mu$m, but the narrow line spacing resulted in a poor visible light transmission factor due to the small aperture ratio of 25% which is substantially smaller than the desired minimum of 50%. According to Comparative Example #B5, a poor invisibility resulted because of the large line width of 50 aim. According Comparative Example #B6 which used a bonding agent layer containing no infrared absorbing agent, a poor infrared blocking resulted. According Comparative Example #B7 which used ITO (indium-tin oxide) vapor deposited on PET film the EMI shielding was poor. According Comparative Example #B8 which used Bonding Agent Layer 10 having the refractive index of 1.43 for the bonding agent layer, because of excessive scattering of light at the interface between the bonding agent layer and the plastic plate similarly as Comparative Example #B3, a poor visible light transmission factor resulted. As opposed to these Comparative Examples, Examples of the present invention which are characterized by an electroconductive metallic material layer which is geometrically patterned by micro-lithography so as to have an aperture ratio of 50% or more, and the bonding agent layer which cures by active radiation energy and has a refractive index of 1.45 to 1.70, the bonding agent layer having a larger thickness than the electroconductive metallic material, and containing an infrared absorbing agent, all the measured values were satisfactory. Particularly favorable results were obtained when the electroconductive metallic material had a line width of 40 $\mu$m or less, a line spacing of 100 $\mu$m or more and a line thickness 40 $\mu$m or less. Although it is not shown in the tables, the bonding agent layer was so fluid that inclusion of air during the process of forming the electromagnetic shielding assembly from the electromagnetic shielding bonding film and the plastic plate was minimized, and favorable results were obtained. Once the bonding agent layer cures by the radiation of the active radiation energy through a crosslinking process, a highly heat-resistant layer can be obtained. The electromagnetic shielding assembly of Example #8 using darkened copper allowed a high contrast and clear images to be viewed.

According to yet another aspect of the present invention, the bonding agent layer may consist of a bonding agent composition which cures or solidifies by heat through crosslinking of the resin and the crosslinking/curing agent by forming a three-dimensional mesh structure.

In this case, the electromagnetic shielding bonding film which essentially consists of geometrically patterned electroconductive material, a thermosetting bonding layer, and plastic film is required to be attached to a bonding object such as a display device or a plastic plate. To this end, it is necessary for the bonding agent to be able to flow. Preferably, the bonding agent layer can be attached to the bonding object by flowing at room temperature or at an elevated temperature. It is then necessary after attachment or at the same time as the attachment for the bonding agent layer to crosslink and cure by heat. The bonding agent is required to be fluid at the time of attachment, and it requires the cure index to be less than 60%. Bonding agent compounds which have already crosslinked or cured can also be used if they turn fluid and become adhesive by heating or pressing. Any material which demonstrate a viscosity of 10,000 poise at 200° C. can be used.

The thermosetting bonding agent layer of the present invention may be obtained by dissolving or dispersing a bonding agent compound in a solvent in the form of varnish, and applying and drying such varnish over the surface of such support members as plastic film and metallic foil. During the drying process, the bonding agent compound is heated and crosslinking/curing due to heating progresses to a certain extent. If the crosslinking/curing progresses too far, the fluidity of the bonding agent layer would be lost. Therefore, the fluidity of the bonding agent layer must be maintained by appropriately controlling various conditions. As such a condition, the cure index of the bonding agent layer should be less than 60%. The care index may be measured by using a DSC (differential scanning calorimeter).

The DSC (differential scanning calorimetry) is based on the principle of supplying and removing heat so as to eliminate a difference in temperature within a prescribed temperature range between the sample and a reference sample which docs not involve any heat generation and absorption, and can be carried out by using a commercially available system The curing of a thermosetting bonding agent layer is a heat exothermic reaction, and generates heat as it is heated at a constant temperature increase due to its own chemical reaction. The amount of heat generation is charted, and the area surrounded by a base line and the exothermic curve gives the amount of heat generation. The amount of heat generation is measured by heating the sample to 200° C. at the rate of 5 to 10° C. per minute. This can be carried out automatically by using a suitable measuring device. Then, the varnish of the bonding agent is applied to the support member, and the amount of heat generation from the sample during the drying process can be obtained as described in the following. First of all, by using a vacuum dryer at 25° C., the total heat generation of the sample which has not crosslinked or cured, but has completely dried of the solvent is measured, and is assumed to be A (1/g). Then, the heat generation from the applied and dried sample is measured, and is assumed to be B (J/g). The cure index C (%) of the sample (after the heat generation ended after heating and drying) is given by the following formula.

$$C(\%) = (A-B) \times 100/A$$

When the cure index is less than 60%, the mesh structure has not fully developed, and the bonding agent layer, still retaining some fluidity, can be attached to the bonding object. On the other hand, when the cure index is 60% or greater, the fluidity of the bonding agent is small, and the bonding agent therefore loses adhering property.

Such thermosetting resins may include natural rubber, isoprene rubber, chloroprene rubber, polyisobutylene, butyl rubber, butyl halide, acrylonitrile-butadiene rubber, styrene-butadiene rubber, polyisobutane, caxboxy rubber, neoprene, and polybutadiene in combination with such crosslining agents as sulfur, aniline-formaldehyde resin, urea-formaldehyde resin, phenol-formaldehyde resin, xylene-formaldehyde resin, melamine-formaldehyde resin, epoxy resin, urea resin, aniline resin, melamine resin, phenol resin, formalin resin, metal oxide, metal chloride, oxime, and alkyl-phenol resin. To the end of speeding up the crosslinking reaction, additives such as common vulcanizers may be used.

A curing reaction can be achieved by combining resins having such functional groups as carboxyl groups, hydroxyl groups, epoxy groups, amino groups, and unsaturated hydrocarbon groups with curing agents having such functional groups as epoxy groups, hydroxyl groups, amino groups, amide groups, carboxyl groups and thiol groups, with curing agents such as metal chlorides, isocyanates, anhydrous acids, metal oxides, and peroxides. To the end of speeding up the curing reaction, additives such as common catalysts may be used. More specifically, such catalysts may include acrylic resins (n=1.45 to 1.47), unsaturated polyester resins (n=1.52 to 1.54), saturated polyester resins (n=1.52 to 1.54), diarylphthalate resins (n=1.57), epoxy resins (n=1.55 to 1.60), furan resins (n=1.55) and polyurethane resins (n=1.5 to 1.6).

In addition to the above mentioned materials, common thermoplastic resins may be blended.

Such thermoplastic resins may include dienes such as natural rubber (refraction index: n=1.52), polyisoprene (n=1.521), poly-1,2-butadiene (n=1.50), polyisobutane (n=1.505 to 1.51), polybutane (n=1.513), poly-2-heptyl-1,3-butadiene (n=1.50), poly-2-t-butyl-1,3-butadiene (n=1.506) and poly-1,3-butadiene (n=1.515), polyethers such as polyoxy-ethylene (n=1.456), polyoxy-propylene (n=1.450), polyvinyl-ethylether (n=1.454), polyvinyl-hexylether (n=1.459) and polyvinyl-butylether (n=1.456), polyesters such as polyvinyl-acetate (n=1.467), and polyvinyl-propionete (n=1.467), polyurethane (n=1.5 to 1.6), ethylcellulose (n=1.479), polyvinyl-chloride (n=1.54 to 1.55), polyacrylonitrile (n=1.52), polymethacrylonitrile (n=1.52), polysulfone (n=1.633), polysulfide (n=1.6) phenoxy resin (n=1.5 to 1.6), and poly (metha) acrylic acid esters such as polyethyl-acrylate (n=1.4685), polybutyl-acrylate (n=1.466), poly-2-ethylhexyl-acrylate (n=1.463), poly-t-butyl-acrylate (n=1.4638), poly-3-ethoxypropyl-acrylate (n=1.465), polyoxycarbonyl-tetramethacrylate (n=1.465), polymethyl-acrylate (n=1.472 to 1A80), polyisopropyl-methacrylate (n=1.473), polydodecil-methacrylate (n=1.474), polytetradecil-methacrylate (n=1.475), poly-n-propyl-methacrylate (n=1.484), poly-3,3,5-trimethyl-cyclohexyl-methacrylate (n=1.484), polyethyl-methacrylate (n=1.485), poly-2-nitro-2-methylpropyl-methacrylate (n=1.487), poly-1,1-diethylpropyl-methacrylate (n=1.489), and polymethyl-methacrylate (n=1.489). Two or more these acrylic polymers may be copolymerized, or may be mixed together as required.

Copolymers of acrylic resin and other resin materials may also be used, and they inlcude epoxyacrylates (n=1.48 to 1.60), urethaneacrylates (n=1.5 to 1.6), polyetheracrylates (n=1.48 to 1.49), and polyesteracrylates (n=1.48 to 1.54). In terms of bonding property, urethaneacrylates, epoxyacrylates and polyetheracrylates are particularly desirable. Such epoxyacrylates include (metha)acrylic acid derivatives such as 1,6-hexandiol-diglycidylether, neopenthylglycol-diglycidylether, arylalcohol-diglycidylether, resorcinol-diglycidylether, diglycidylester adipate, diglycidylester phthalate, polyethyleneglycol-diglycidylesther, trimethylolpropane-triglycidylether, glycerin-triglycidylether, pentaerythritol-tetraglycidylether, and sorbitol-tetraglycidylether. Epoxyacrylates are effective in improving bonding property as they contain hydroxyl groups in their molecules, and these copolymers can be used either individually or in combination. The softening temperature of the polymer that can be used for the bonding agent of the present invention is preferably 200° C. or lower for the convenience of handling, and is even more preferable if it 150° C. or lower. Because such electromagnetic shielding bonding film is normally used in the environments of 80° C. or lower, in view of the workability, the most preferred range of the softening temperature is 80 to 120° C. The weight-average molecular weight of the main polymer in the bonding agent should be 500 or greater. If the molecular weight is less than 500, the cohesive force of the composition is so small that a satisfactory attachment to the object may not be achieved A diluting agent, plasticizer, anti-oxidixation agent, filer, coloring agent, UV absorbing agent, and viscosity increasing agent may be added to the bonding agent composition as required.

The refractive index of the bonding agent layer consisting of thermosetting resin is preferably in the range of 1.45 to 1.70. This is because if there is any significant difference in refraction index between the plastic film and the bonding agent which are used in the invention, and the bonding agent of the present invention and the bonding agent which is used for attaching electroconductive metallic material to the plastic film, the visible light transmission factor drops. However, if the refractive index is in the range of 1.45 to 1.70 such a drop in the visible light transmission facto can be avoided, and the polymers mentioned above all fall within this range The electromagnetic shielding bonding film of the present invention essentially consists of a bonding agent layer consisting of thermosetting resin, geometrically patterned electroconductive metallic material, and plastic film. The electroconductive metallic material preferably consists of metal foil, and in such a case, the bonding surface of the metallic foil is typically made into a coarse surface so as to achieve a desired bonding strength. When the electroconductive metallic material is geometrically patterned, the part of the surface of the bonding layer from which the electroconductive metallic material has been removed presents an irregular surface because the marks of the reverse surface of the electroconductive metallic material were imprinted on the surface of the bonding layer, and the resulting irregular reflection of visible light on the surface may damage the transparency of the plastic film. It may also the case that the surface of the plastic film may be intentionally given with an irregular texture by adding a small amount of filler with the aim of improving the molding result, and reducing the friction of the film to facilitate the winding of the plastic film into a roll, and by applying a matte process to increase the bonding force of the bonding agent. The transparency of the plastic film may be thus damaged by the irregular surface texture in the part of the surface of the plastic film from which the electroconductive material has been removed or the plastic film itself due to the intentional surface roughening process to improve the bonding property and due to the imprinting of the surface texture of the reverse surface of the electroconductive metallic material. However, the bonding layer of the present invention consisting of thermosetting resin fills such irregular surface textures because it is highly fluid owing to the lack of any crosslinking or curing structure, and in particular, when resin material having a refraction index close to that of the plastic film is smoothly coated over the surface, irregular surface reflection can be minimized. Once the bonding agent layer cures by active energy radiation, a highly heat-resistant bonding layer can be obtained. The geometrically patterned electroconductive metallic material on the film surface has such a small line width that it is virtually invisible to naked eyes. Also, because of the sufficient large spacing, an apparent transparency can be attained. However, the line spacing of the geometric pattern is sufficiently small than the wavelength of the electromagnetic radiation which is to be shielded so that a favorable shielding property can be achieved The present invention is described in the following in terms of preferred embodiments, but is not limited by these embodiments.

<Example #C1>

<Electromagnetic Shielding Bonding Film #C1 and Electromagnetic Shielding Assembly #C1>

The plastic film consisted of transparent polyethyleneterephthalate (PET) film having the thickness of 50 $\mu$m (marketed by Toyo Boseki KK under the tradename of A-4100, refraction index n=1,575). Bonding Agent Layer #C1 containing an infrared absorbing agent which is described hereinafter was applied on one side of this plastic film to a prescribed dry thickness at room temperature by using an applicator, and was heated and dried at 90° C. for 5 minutes. An electrolytic copper foil having the thickness of 12 $\mu$m serving as the electroconductive metallic material was laminated over the surface of Bonding Agent Layer #C1 with its coarse surface facing the bonding layer, and was laminated by heating, under the condition of 90° C. and 10 kgf/cm$^2$ to obtain PET film carrying copper foil as plastic film carrying electroconductive material.

The obtained PET film laminated with copper foil is subjected to a photo-lithographic process (including the steps of resist film coating, photographic exposure, photographic development, chemical etching, and resist film removal), and a copper grid pattern having the line width of 25 $\mu$m and the line spacing of 250 $\mu$m was formed on the surface of the PET film to obtain Electromagnetic Shielding Bonding Film #C1. The visible light transmission factor of Electromagnetic Shielding Bonding Film #C1 was 20% or less. Thereafter, Electromagnetic Shielding Bonding Film #C1 was applied over the surface of commercially available acrylic plate (marketed by KK Kurare under the tradename of Komoglass, thickness 3 mm, n=1.49) by using a thermal press, with the bonding layer facing the acrylic plate, under the temperature and pressure condition of 110° C., 20 kgf/cm$^2$ and 15 minutes to obtain Electromagnetic Shielding Assembly #1.

Example #C1 consisted of Electromagnetic Shielding Assembly #C1 which was formed by combining Electromagnetic Shielding Bonding Film #C1 carrying Bonding Agent Layer #C1 at the dry thickness of 20 μm, and the plastic plate.

<Composition of Bonding Agent Layer #C1>

| | |
|---|---|
| Pyron 200 (Toyo Boseki KK, saturated polyester resin, Mn = 20,000) | 100 weight parts |
| SIR-159 (Infrared Absorbing Agent #C1; Mitsui Toatsu Kagaku KK, metallic complex compound) | 0.5 weight parts |
| Sumijule N (Sumitomo Bayer Urethane KK, aliphatic three function isocyanate) | 5 weight parts |
| toluen | 450 weight parts |
| ethyl acetate | 10 weight parts |

After drying the solvent, the composition of Bonding Agent Layer #C1 had a refractive index of 1.54, and the DSC cure index before curing (after lamination) was 10%.

<Example #C2>

<Electromagnetic Shielding Bonding Film #C2 and Electromagnetic Shielding Assembly #C2>

The plastic film consisted of transparent polyethyleneterephthalate (PET) film having the thickness of 25 μm. Bonding Agent Layer #2 containing an infrared absorbing agent which is described hereinafter was applied on one side of this plastic film to a prescribed dry thickness at room temperature by using an applicator, and was heated and dried at 90° C. for 20 minutes. Am aluminum foil having the thickness of 25 μm was laminated over the surface of Bonding Agent Layer #C2, and was laminated by heating, under the condition of 100° C. and 10 kgf/cm$^2$ to obtain PET film carrying aluminum foil. The obtained PET film laminated with aluminum foil is subjected to a photolithographic process similarly as Electromagnetic Shielding Bonding Film #C1 and Electromagnetic Shielding Assembly #C1, and an aluminum grid pattern having the line width of 15 μm and the line spacing of 125 μm was formed on the surface of the PET film to obtain Electromagnetic Shielding Bonding Film #C2. The visible light transmission factor of Electromagnetic Shielding Bonding Film #C2 was 20% or less. Thereafter, Electromagnetic Shielding Bonding Film #C2 was applied over the surface of commercially available acrylic plate (marketed by KK Kurare under the tradename of Komoglass, thickness 3 mm) by using a thermal press, with the bonding layer facing the acrylic plate, under the temperature and pressure condition of 120° C., 30 kgf/cm$^2$ and 30 minutes to obtain Electromagnetic Shielding Assembly #C2.

Example #C2 consisted of Electromagnetic Shielding Assembly #C-2 which was formed by combining Electromagnetic Shielding Bonding Film #C2 carrying Bonding Agent Layer #C2 at the dry thickness of 40

<Composition of Bonding Agent Layer #C2>

| | |
|---|---|
| VM-D Medium (Dainich Seika Kogyo KK, vinylchloride, vinylacetate, acrylic acid three-element copolymer) | 100 weight parts |
| UFP-HX (Infrared Absorbing Agent #C2; Sumitomo Kinzoku Kozan KK, ITO, average particle diameter 0.1 μm) | 0.4 weight parts |
| Sumijule N (Sumitomo Bayer Urethane KK, aliphatic three function isocyanate) | 5 weight parts |
| MEK | 330 weight parts |
| cyclohexane | 15 weight parts |

After drying the solvent, the composition of Bonding Agent Layer #C2 had a refractive index of 1.51, and the DSC cure index before curing (after lamination) was 15%.

<Example #C3>

<Electromagnetic Shielding Bonding Film #C3 and Electromagnetic Shielding Assembly #C3>

Bonding Agent Layer #C3 which is described hereinafter was applied on one side of PET film having the thickness of 50 μm at room temperature by using an applicator, and was heated and dried at 90° C. for 5 minutes. Electroless nickel plating was formed over the surface of Bonding Agent Layer #C3 in a grid pattern by using a mask so as to achieve a line width of 10 n a line spacing of 100 μm and a line thickness of 1 m to obtain Electromagnetic Shielding Bonding Film #C3 consisting of PET film carrying nickel in a grid pattern. The visible light transmission factor of Electromagnetic Shielding Bonding Film #C3 was 20% or less. Thereafter, Electromagnetic Shielding Bonding Film #C3 was applied over the surface of commercially available acrylic plate (marketed by KK Kurare under the tradename of Komoglass, thickness 3 mm) by using a roll laminator, with the bonding layer facing the acrylic plate, under the temperature and pressure condition of 110° C., and 20 kgf/cm$^2$ to obtain Electromagnetic Shielding Assembly #C3.

Example #C3 consisted of Electromagnetic Shielding, Assembly #C3 which was formed by combining Electromagnetic Shielding Bonding Film #C3 carrying Bonding Agent Layer #C3 at the dry thickness of 5 μm, and the plastic plate.

<Composition of Bonding Agent Layer #C3>

| | |
|---|---|
| S-1005 (Toa Gosei Kagaku Kogyo KK, acrylic resin) | 100 weight parts |
| IRG-002 (Infrared Absorbing Agent #C3; Nihon Kayaku KK, aminium compound) | 1.2 weight parts |
| Sumijule N (Sumitomo Bayer Urethane KK, aliphatic three function isocyanate) | 5 weight parts |
| MEK | 285 weight parts |
| cyclohexane | 5 weight parts |

After drying the solvent, the composition of Bonding Agent Layer #C3 had a refractive index of 1.50, and the DSC cure index before (after lamination) was 5%.

<Example 4C4>

The composition of Bonding Agent Layer #C4 was applied to the dry thickness of 20 μm. Example #C4 consisted of Electromagnetic Shielding Assembly #C4 which combined Electromagnetic Shielding Bonding Film #C4, prepared in the same way as with Electromagnetic Shielding Bonding Film #C1, with an acrylic plate.

<Composition of Bonding Agent Layer #C4>

| | |
|---|---|
| Vistanex MML-140 (Tonex KK, polyisobutylene) | 100 weight parts |
| IRG-002 (Infrared Absorbing Agent #C3; Nihon Kayaku KK, aminium compound) | 1.2 weight parts |
| zinc oxide (Sakai Kagaku Kogyo KK) | 5 weight parts |
| MEK | 285 weight parts |
| cyclohexane | 5 weight parts |

After drying the solvent, the composition of Bonding Agent Layer #C4 had a refractive index of 1.45, and the DSC cure index before curing (after lamination) was 3%

<Example #C5>

Bonding Agent Layer #C5 having the composition given below was applied to the dry thickness of 20 $\mu$m Example #C5 consisted of Electromagnetic Shielding Assembly #C5 which was combined Electromagnetic Shielding Bonding Film #C5, prepared in the same way as with Example #C1, with an acrylic plate.

| <Composition of Bonding Agent Layer #C5> | |
|---|---|
| VR-103 (Mitsui DuPont Polychemical KK, anhydrous maleic acid denatured EVA, vinyl acetate denaturing ratio 30 weight %) | 100 weight parts |
| IRG-002 (Infrared Absorbing Agent #C3; Nihon Kayaku KK, aminium compound) | 1.2 weight parts |
| Sumijule N (Sumitomo Bayer Urethane KK, aliphatic three function isocyanate) | 5 weight parts |
| MEK | 285 weight parts |
| cyclohexane | 5 weight parts |

After drying the solvent, the composition of Bonding Agent Layer #5 had a refractive index of 1.47, and the DSC cure index before curing (after lamination) was 10%.

<Example #C6>

Example #C6 consisted of Electromagnetic Shielding Assembly #C6 which was identically prepared as Example #C1 except for that the dry thickness of Bonding Agent Layer #C6 was 20 $\mu$m.

<Composition of Bonding Agent Layer #C6> Epicoat TL-983U (Yuka Shell Epoxy KK,

| <Composition of Bonding Agent Layer #C6> | |
|---|---|
| Epicoat TL-983U (Yuka Shell Epoxy KK, bisphenol type F epoxy resin, epoxy equivalent 170) | 100 weight parts |
| SIR-159 (Infrared Absorbing Agent #C1; Mitsui Toatsu Kagaku KK), | 0.5 weight parts |
| Sumijule N (Sumitomo Bayer Urethane KK, aliphatic three function isocyanate) | 5 weight parts |

-continued

| <Composition of Bonding Agent Layer #C6> | |
|---|---|
| toluen | 450 weight parts |
| ethyl acetate | 10 weight parts |

After drying the solvent, the composition of Bonding Agent Layer #C6 had a refractive index of 1.49, and the DSC cure index before curing (after lamination) was 5%.

<Example #C7>

Example #C7 consisted of Electromagnetic Shielding Assembly #C7 which was identically prepared as Example #C2 except for that the plastic film consisted of polycarbonate film (50 $\mu$m, n=1.58) instead of PET film (50 $\mu$m) and the thickness of the bonding agent layer was 20 $\mu$m instead of 30 $\mu$m.

<Example #C8>

Example #C8 consisted of Electromagnetic Shielding Assembly #C8 which was identically prepared as Example #C3 except for that the line width was 30 $\mu$m Instead of 10 $\mu$m, the line spacing was 500 $\mu$m instead of 100 $\mu$m, and the bonding layer thickness was 10 $\mu$m instead of 5 $\mu$m.

<Example #C9>

Example #C9 consisted of Electromagnetic Shielding Assembly #C9 which was identically prepared as Example #C1 except for that the copper grid pattern formed on the PET film by the photo-lithographic process was darkened.

<Comparative Example #C1>

Comparative Example #C1 consisted of an electromagnetic shielding assembly made by applying Bonding Agent layer #C1 onto PET film having the thickness of 50 $\mu$m to the dry thickness of 20 $\mu$m by using an applicator, and heating and drying the assembly at 100° C. for 30 minutes. The DSC cure index was 80%. Thereafter, in the same way as Example #C1, Electromagnetic Shielding Assembly #C10 was obtained by heating and pressing the assembly by using a thermal press under the condition of 110° C., 20 kg.cm$^2$, and 15 minutes.

<Comparative Example #C2>

Comparative Example #C2 consisted of an electromagnetic shielding assembly made by applying Bonding Agent Layer #C2 onto PET film having the thickness of 25 $\mu$m to the dry thickness of 40 $\mu$m by using an applicator, and heating and drying the assembly at 100° C. for 30 minutes. The DSC cure index was 85%. Thereafter, in the same way as Example #C2, Electromagnetic Shielding Assembly #C11 was obtained by heating and pressing the assembly by using a thermal press under the condition of 120° C., 30 kg.cm$^2$, and 30 minutes.

<Comparative Example #C3>

Comparative Example #C3 consisted of an electromagnetic shielding assembly which was prepared identically as Example #C3 except for that phonol-formaldehyde resin (Mw=50,000) was used instead of S-1005 of Bonding Agent Layer #C3, and Bonding Agent Layer #C7 was obtained by eliminating Sumijule N. Comparative Example #C3 consisted of Electromagnetic Shielding Assembly #C12 which was otherwise identically prepared as Example #C3.

<Comparative Example #C4>

Comparative Example #C4 consisted of Electromagnetic Shielding Assembly #C13 which was prepared identically as Example #C1 except for that the line width was 5 μm instead of 20 μm <Comparative Example #C5>

Comparative Example #C5 consisted of Electromagnetic Shielding Assembly #C14 which was prepared identically as Example #c1 except for that the line spacing was 50 μm instead of 250 μm.

<Comparative Example #C6>

Comparative Example #C6 consisted of Electromagnetic Shielding Assembly #C15 which was prepared identically Example #C1 except for that the line width was 50 pan instead of 25 μm and the line spacing was 150 μm instead of 250 μm.

<Comparative Example #C7>

Comparative Example #C7 consisted of Electromagnetic Shielding Assembly #C16 which was prepared identically as Example #C2 except for that the infrared absorbing agent was removed from Bonding Agent Layer #C2.

<Comparative Example #C8>

Comparative Example #C8 consisted of Electromagnetic Shielding. Assembly #C17 which was prepared identically as Example #C1 except for that the electroconductive material consisted of ITO uniformly vapor deposited over the surface of the PET film to the thickness of 0.1 μm (1,000Å) without geometric patterning, and the infrared absorbing agent was removed from the composition of Bonding Agent Layer #C1 which was directly applied to the surface of the electroconductive material.

<Comparative Example #C9>

Comparative Example #C9 consisted of Electromagnetic Shielding Assembly #C18 which was prepared identically as Example #C3 except for that polydimethylsiloxane (Mw= 45,000, n=1.43) was used as Bonding Agent Layer #C10. The conditions were otherwise identical to those of Example #C3.

The aperture ratio of the geometric pattern of the electroconductive metallic material formed over the electromagnetic shielding bonding film, EMI shielding performance, visible light transmission factor, invisibility, infrared blocking ratio, and bonding force before and after heating were actually measured, and the measured results arc summarized in Tables 5 and 6.

The refractive index was measured by using a refraction meter (marketed by KK Atago Kogaku Kikai Seisakusho under the tradename of Abbe refraction meter) at the temperature of 25° C. The aperture ratio of the geometric pattern of the electroconductive metallic material formed over the electromagnetic shielding bonding film was actually measured from the microscopic photograph. The DSC was measured by using a differential scanning calorimeter (marketed by DuPont under the tradename of type 910-DSC) over the temperature range of room temperature (25° C.) to 200° C. at the temperature increase rate of 10° C. per minute.

The EMI shielding performance was measured by placing the specimen between two flanges of a coaxial waveguide converter (marketed by Nihon Koshuha KK under the tradename of TWC-S-024), and using a spectro-analyzer (marketed by YHP under the tradename of 8510B Vector Network Analyzer) over the frequency range of 30 MHz to 1 GHz.

The visible light transmission factor was measured as an average value of the transmission factor over the wavelength range of 400 to 700 run by using a double beam spectrophotoanalyzer (marketed by KK Hitachi under the tradename of Type 200-10).

The invisibility was measured by viewing the electromagnetic shielding assembly incorporated with the electromagnetic shielding bonding film at the distance of 0.5 μm, and evaluating if the geometric pattern of the electroconductive metallic material was visible or not. The specimens were graded into "good" and "NG" depending on if the pattern was visible or not.

The infrared blocking ratio was measured as an average value of the infrared absorption ratio for the wavelength range of 900 to 1,100 nm by using a spectrophotometer (marketed by KK Hitachi Seisakusho under the tradename of U-3410). The bonding force was measured by using a tensile strength testing machine (marketed by Toyo Baldwin KK under the tradename of Tensilon UTM-4-100) with the width of 10 mm, 90 degree as direction and peeling speed of 50 mm/minute.

| category | Examples items | #C1 | #C2 | #C3 | #C4 | #C5 | #C6 | #C7 | #C8 | #C9 |
|---|---|---|---|---|---|---|---|---|---|---|
| structure | Bonding Agent Composition | #C1 | #C2 | #C3 | #C4 | #C5 | #C6 | #C2 | #C3 | #C1 |
| | Infrared Absorbing Agent | #C1 | #C2 | #C3 | #C3 | #C3 | #C1 | #C2 | #C3 | #C1 |
| | bonding layer thickness (μm) | 20 | 40 | 5 | 20 | 20 | 20 | 30 | 10 | 20 |
| | conductive material thickness (μm) | Cu(12) | Al(25) | Ni(1) | Cu(12) | Cu(12) | Cu(12) | Al(25) | Ni(1) | Cu(12) darkened |
| | plastic film thickness (μm) | PET(50) | PET(50) | PET(50) | PET(50) | PET(50) | PET(50) | polycarbonate(50) | PET(50) | PET(50 |
| | line width spacing (μm) | 25–250 | 15–125 | 10–100 | 25–250 | 25–260 | 25–250 | 15–126 | 300–600 | 25–260 |

4500-1

4500-1

| category | Examples items | #C1 | #C2 | #C3 | #C4 | #C5 | #C6 | #C7 | #C8 | #C9 |
|---|---|---|---|---|---|---|---|---|---|---|
| | patterning method | chemical etching | chemical etching | plating | chemical etching | chemical etching | chemical etching | chemical etching | plating | chemical etching |
| property | aperture ratio (%) | 81 | 77 | 80 | 81 | 81 | 81 | 77 | 88 | 81 |
| | EMI shield (dB) | 47 | 55 | 60 | 47 | 47 | 47 | 55 | 37 | 47 |
| | visible light transmission factor (%) | 66 | 62 | 65 | 65 | 6 | 64 | 64 | 77 | 66 |
| | invisibility | good | good | good | good | good | good | good | good | good |
| | infrared blocking property (%) | 76 | 70 | 82 | 75 | 76 | 78 | 71 | 80 | 75 |
| | initial bonding force (kgf/cm$^2$) | 1.3 | 1.0 | 1.2 | 1.0 | 1.1 | 1.5 | 1.0 | 1.2 | 1.2 |
| | bonding force after 80° C. 100 hrs of aging (kgf/cm$^2$) | 1.5 | 1.0 | 1.4 | 1.0 | 1.0 | 1.7 | 1.0 | 1.4 | 1.4 |
| | initial bonding force at 80° C.(kgf/cm$^2$) | 1.2 | 0.8 | 1.1 | 0.9 | 0.9 | 1.8 | 0.8 | 1.2 | 1.1 |

4500-2

| category | Comparative Examples items | #C1 | #C2 | #C3 | #C4 | #C5 | #C6 | #C7 | #C8 | #C9 |
|---|---|---|---|---|---|---|---|---|---|---|
| structure | Bonding Agent Composition | #C1 | #C2 | #C7 | #C1 | #C1 | #C1 | #C2 | — | 10 |
| | Infrared Absorbing Agent | #C1 | #C2 | #C3 | #C1 | #C1 | #C1 | none | none | 3 |
| | bonding layer thickness (μm) | 20 | 40 | 5 | 5 | 20 | 20 | 40 | — | 5 |
| | conductive material thickness (μm) | Cu(12) | Al(25) | Ni(1) | Cu(12) | Cu(12) | Cu(12) | Al(25) | ITO(0.1) | Ni(1) |
| | plastic film thickness (μm) | PET(50) | PET(25) | PET(50) | PET(50) | PET(50) | PET(50) | PET(25) | PET(50) | PET(50) |
| | line width spacing (μm) | 25–250 | 16–125 | 10–100 | 25–60 | 25–50 | 50–150 | 16–126 | — | 10–100 |
| | patterning method | chemical etching | chemical etching | plating | chemical etching | chemical etching | chemical etching | chemical etching | uniform vapor deposition | plating |
| property | aperture ratio (%) | 81 | 77 | 50 | 8 | 25 | 44 | 77 | — | 80 |
| | EMI shield (dB) | 47 | 55 | 60 | 47 | 62 | 58 | 55 | <20 | 60 |
| | visible light transmission factor (%) | <20 | <20 | 25 | 29 | <20 | 33 | 70 | 70 | 29 |
| | invisibility | NG | NG | NG | NG | good | NG | good | good | NG |
| | infrared blocking property (%) | NA due to excessive dispersion | NA due to excessive dispersion | NA due to excessive dispersion | NA due to excessive dispersion | 90 | 89 | <20 | <20 | NA due to excessive dispersion |
| | initial bonding force (kgf/cm$^2$) | <0.2 | <0.2 | 1.3 | <0.2 | 1.3 | 1.3 | 1.0 | — | 1.2 |
| | bonding force after 80° C. 100 hrs of aging (kgf/cm$^2$) | <0.2 | <0.2 | 1.4 | <0.2 | 1.5 | 1.5 | 1.0 | — | 1.2 |
| | initial bonding force at 80° C.(kgf/cm$^2$) | 0.0 | 0.0 | 0.4 | 0.0 | 1.2 | 1.2 | 0.8 | — | — |

According to Comparative Examples #C1 and #C2, the cure index of the bonding agent layer was as high as 60% or more, and due to the lack of fluidity of the bonding agnet layer, the bonding agent was unable flow more than the thickness of the geometrically patterned electroconductive metallic material such as copper foil and aluminum foil so that the bonding agent layer failed to closely attach to the plastic plate of the bonding object. As a result, the bonding force was inadequate. Also, the irregular surface texture imprinted on the surface of the bonding agent layer remained permanently due to the lack of fluidity, and the resulting irregular dispersion of the transmission light causes a low visible transmission factor. According to Comparative Example #C3, Bonding Agent Layer #C7 had a high refraction index of 1.73, and the excessive scattering of light at the interface between the bonding agent layer and the plastic plate resulted in a low visible light transmission factor. According to Comparative Example #C4, because the thickness of 5 μm of Bonding Agent Layer #C1 was smaller than the thickness of 12 μm of the copper foil, a favorable attachment between Bonding Agent Layer #C1 and the plastic plate was achieved owing to the fluidity of Bonding Agent Layer #C1, but the failure to completely embed the electroconductive metallic material in the bonding agent layer resulted in a poor visible light transmission factor. According to Comparative Example #C5, a favorable EMI shielding was achieved owing to the line spacing of 50 μm, and a favorable invisibility was attained owing to the fine line width of 25 μm, but the narrow line spacing resulted in a poor visible light transmission factor due to the small aperture ratio of 25% which is substantially smaller than the desired minimum of 50%. According to Comparative Example #C6, a poor invisibility resulted because of the large line width of 50 μm. According Comparative Example #C7 which used a bonding agent layer containing no infrared absorbing agent, a poor infrared blocking resulted. According Comparative Example #C8 which used ITO (indium-fin oxide) vapor deposited on PET film, the EMI shielding was poor. According Comparative Example #C9 which used Bonding Agent Layer 10 having the refractive index of 1.43 for the bonding agent layer, because of excessive scattering of light at the interface between the bonding agent layer and the plastic plate similarly as Comparative Example #C3, a poor visible light transmission factor resulted. As opposed to these Comparative Examples, Examples of the present invention which arc characterized by an electroconductive metallic material layer which is geometrically patterned so as to have an aperture ratio of 50% or more, and the bonding agent layer consisted of thermosetting resin and had a refractive index of 1.45 to 1.70, the bonding agent layer having a larger thickness than the electroconductive metallic material, and containing an infrared absorbing agent, all the measured values were satisfactory. Particularly favorable results were obtained when the electroconductive metallic material had a line width of 40 μm or less, a line spacing of 100 μm or more and a line thickness 40 μm or less. The electromagnetic shielding assembly of Example #C9 using darkened copper allowed a high contrast and clear images to be viewed.

As can be appreciated from the description of the embodiments, the electromagnetic shielding bonding film according to the present invention can be applied very closely to the object so that a favorable EMI shielding performance can be achieved substantially without any electromagnetic leakage. The present invention can provide superior electromagnetic shielding bonding film which has favorable optical properties in terms of visible light transmission factor and invisibility, and involves very little change in the bonding properties at high temperatures over an extended period of time.

By using photo-lithography for the micro-lithography, there is provided electromagnetically shielding bonding film which is economical and suited for mass production, and provides a high EMI shielding performance, transparency, and convenient bonding property.

If the softening temperature of the bonding agent layer is 200° C. or lower, there is provided electromagnetically shielding bonding film which can be readily attached to a bonding object, and is easy to handle.

If the bonding agent layer has a refraction index of 1.45 to 1.70, there is provided electromagnetically shielding bonding film which is highly transparent and capable of offering clear images.

If the bonding agent layer has a larger thickness than the electroconductive metallic material layer, there is provided electromagnetically shielding bonding film which is highly transparent and as a favorable bonding property.

If the bonding agent layer which flows under heat or pressure contains an infrared absorbing agent, there is provided electromagnetically shielding bonding film which is highly transparent and capable of blocking infrared radiation.

If the geometrically patterned electroconductive metallic material layer has a line width of 40 μm or less, a line spacing of 100 μm or more and a line thickness 40 Am or less, there is provided electromagnetically shielding bonding film which is highly transparent and provides a wide view angle.

If the geometrically patterned electroconductive metallic material layer consists of a copper, aluminum or nickel layer having a thickness of 0.5 to 40 μm, there is provided electromagnetically shielding bonding film which is capable of shielding EMI, highly workable and economical.

If the photo-lithography consists of a chemical etching process, there is provided electromagnetically shielding bonding film which is economical and provides a high visible transmission factor.

If the plastic film carrying the electroconductive metallic material layer consists of polyethylene-terephthalate film or polycarbonate film, there is provided electromagnetically shielding bonding film which is economical, transparent, and heat-resistant.

If the electroconductive metallic material consists of copper which at least has a darkened surface, there is provided electromagnetically shielding bonding film which is capable of providing a high contrast display and a favorable EMI shielding If the electroconductive metallic material consists of paramagnetic metallic material, there is provided electromagnetically shielding bonding film which is capable of effectively shielding a magnetic field.

If the electromagnetic shielding assembly comprises a plastic plate and the electromagnetic shielding bonding film, there is provided a base sheet which is transparent and effective in shielding EMI, and which is suitable for use in display devices.

If the electromagnetic shielding assembly comprises a plastic plate and the electromagnetic shielding bonding film attached to one side of the plastic plate, there is provided a base sheet which is transparent and effective in shielding EMI, and which is suitable for use in display devices.

If the electromagnetic shielding assembly comprises a plastic plate, the electromagnetic shielding bonding film attached to one side of the plastic plate, and a bonding agent or a bonding film having an infrared blocking property attached to the other side of the plastic plate, there is provided a base sheet which is transparent and effective in blocking infrared radiation.

By applying the transparent electromagnetic shielding bonding film to a display device, there is provided a display device which is light in weight, compact and free from electromagnetic leakage.

By applying the transparent, electromagnetic shielding assembly to a display device, there is provided a display device which is light in weight, compact and free from electromagnetic leakage provided with a protective plate at the same time. When ti is applied to a display device, because of the high visible light transmission factor and the favorable invisibility, it becomes possible to allow the display device to be viewed comfortably and naturally without increasing the display intensity.

Because the electromagnetic shielding bonding film and the electromagnetic shielding assembly according to the present invention are highly transparent and effective in shielding electromagnetic radiation, they can be favorably used, in addition to the application to display devices, for shielding electromagnetic radiation by being mounted on the cases for measuring instruments, measuring devices and manufacturing devices, and inspection windows for such cases, and for protecting appliances and devices from electromagnetic radiation by being mounted on the cases for such appliances and devices, and windows for such cases that require to be transparent.

What we claim is:

1. An Electromagnetic shielding bonding film, comprising:

a substantially transparent plastic base film;

an electroconductive metallic material layer which is geometrically patterned on said plastic base film so as to have an aperture ratio of 50% or more; and a bonding agent layer placed at least over a part of said plastic base film not covered by said electroconductive metallic material layer, wherein said bonding agent layer becomes fluid under predetermined conditions.

2. Electromagnetic shielding bonding film according to claim 1, wherein said bonding agent is placed substantially over entire surface of one side of said plastic base film carrying said geometrically patterned electroconductive metallic material layer.

3. Electromagnetic shielding bonding film according to claim 1, wherein said bonding agent becomes fluid under heat and/or pressure.

4. Electromagnetic shielding bonding film according to claim 3, wherein said bonding agent layer which flows under heat or pressure has a softening temperature of 200° C. or lower.

5. Electromagnetic shielding bonding film according to claim 1, wherein said bonding agent layer is curable by irradiation with active radiation energy.

6. Electromagnetic shielding bonding film according to claim 5, wherein said radiation energy consists of ultraviolet or electron beam radiation.

7. Electromagnetic shielding bonding film according to claim 1, wherein said bonding agent layer consists of thermosetting resin.

8. Electromagnetic shielding bonding film according to claim 7, wherein said thermosetting bonding agent layer has a cure index which is less than 60%.

9. Electromagnetic shielding bonding film according to claim 1, wherein said electroconductive metallic material layer is geometrically patterned by micro-lithography.

10. Electromagnetic shielding bonding film according to claim 9, wherein said micro-lithography consists of photo-lithography.

11. Electromagnetic shielding bonding film according to claim 1, wherein said bonding agent layer has a refraction index of 1.45 to 1.70.

12. Electromagnetic shielding bonding film according to claim 1, wherein said bonding agent layer has a larger thickness than said electroconductive metallic material layer.

13. Electromagnetic shielding bonding film according to claim 1, wherein said bonding agent layer contains an infrared absorbing agent.

14. Electromagnetic shielding bonding film according to claim 1, wherein said geometrically patterned electroconductive metallic material layer has a line width of 40 μm or less, a line spacing of 100 μm or more and a line thickness 40 μm or less.

15. Electromagnetic shielding bonding film according to claim 1, wherein said geometrically patterned electroconductive metallic material layer consists of a copper, aluminum or nickel layer having a thickness of 0.5 to 40 μm.

16. Electromagnetic shielding bonding film according to claim 10, wherein said photo-lithography consists of a chemical etching process.

17. Electromagnetic shielding bonding film according to claim 1, wherein said plastic film carrying said electroconductive metallic material layer consists of polyethyleneterephthalate film or polycarbonate film.

18. Electromagnetic shielding bonding film according to claim 1, wherein said electroconductive metallic material consists of copper which at least has a darkened surface.

19. Electromagnetic shielding bonding film according to claim 1, wherein said electroconductive metallic material consists of paramagnetic metallic material.

* * * * *